(12) United States Patent
Takeuchi et al.

(10) Patent No.: US 6,448,693 B1
(45) Date of Patent: Sep. 10, 2002

(54) PIEZOELECTRIC/ELECTROSTRICTIVE DEVICE AND METHOD OF MANUFACTURING SAME

(75) Inventors: Yukihisa Takeuchi, Nishikamo-Gujn; Tsutomu Nanataki, Toyoake; Koji Kimura, Nagoya, all of (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/669,441

(22) Filed: Sep. 25, 2000

(30) Foreign Application Priority Data

| Oct. 1, 1999 | (JP) | 11-281522 |
| Oct. 28, 1999 | (JP) | 11-307844 |
| Nov. 16, 1999 | (JP) | 11-326195 |
| Dec. 27, 1999 | (JP) | 11-371967 |
| Jan. 21, 2000 | (JP) | 2000-013576 |
| Jan. 24, 2000 | (JP) | 2000-015123 |
| Mar. 1, 2000 | (JP) | 2000-056434 |
| Aug. 7, 2000 | (JP) | 2000-238241 |

(51) Int. Cl.$^7$ ............................................. H01L 41/08
(52) U.S. Cl. ......................... 310/328; 310/330; 310/331
(58) Field of Search .............................. 310/328, 330, 310/344, 331

(56) References Cited

U.S. PATENT DOCUMENTS

| 5,063,321 A | 11/1991 | Carter | 310/323 |
| 5,691,594 A | 11/1997 | Takeuchi et al. | 310/330 |
| 5,693,997 A | 12/1997 | Griffith et al. | 310/328 |
| 5,747,915 A | * 5/1998 | Benavides | 310/306 |
| 5,912,524 A | 6/1999 | Ohnishi et al. | 310/321 |
| 5,969,248 A | 10/1999 | Kurachi et al. | 73/504.12 |
| 6,049,158 A | 4/2000 | Takeuchi et al. | 310/328 |
| 6,109,104 A | 8/2000 | Fukuda et al. | 73/504.13 |
| 6,140,739 A | 10/2000 | Arai et al. | 310/321 |
| 6,262,516 B1 | 7/2001 | Fukuda et al. | 310/328 |
| 6,267,146 B1 | 7/2001 | Miyazoe et al. | 137/883 |

FOREIGN PATENT DOCUMENTS

| EP | 1 017 116 A2 | 7/2000 | H01L/41/09 |
| EP | 1 089 351 A2 | 4/2001 | H01L/41/08 |
| EP | 1 089 352 A2 | 4/2001 | H01L/41/08 |
| EP | 1 089 356 A2 | 4/2001 | H01L/41/09 |
| EP | 1 089 358 A2 | 4/2001 | H01L/41/09 |
| JP | 61-183981 | 8/1986 | H01L/41/08 |
| JP | 62-168535 | 10/1987 | H01L/57/00 |
| JP | 63-64640 | 3/1988 | G11B/7/09 |
| JP | 1-107997 | 7/1989 | G12B/5/00 |
| JP | 02-119278 | 5/1990 | H01L/41/09 |
| JP | 2-159982 | 6/1990 | H02N/2/00 |
| JP | 10-136665 | 5/1998 | H02N/2/00 |
| JP | 11-51959 | 2/1999 | G01P/15/09 |
| WO | 01/26166 A1 | 4/2001 | H01L/41/08 |
| WO | 01/26169 A1 | 4/2001 | H01L/41/08 |

OTHER PUBLICATIONS

U.S. application No. 09/642,861, Takeuchi et al., filed Aug. 21, 2000.
U.S. application No. 09/643,163, Takeuchi et al., filed Aug. 21, 2000.

(List continued on next page.)

Primary Examiner—Thomas M. Dougherty
(74) Attorney, Agent, or Firm—Burr & Brown

(57) ABSTRACT

A piezoelectric/electrostrictive device includes a pair of mutually opposing thin plate sections, a movable section, and a fixing section for supporting the thin plate sections and the movable section. Piezoelectric/electrostrictive elements are arranged on at least one thin plate section of the pair of thin plate sections. A hole is formed by both inner walls of the pair of thin plate sections, an inner wall of the movable section, and an inner wall of the fixing section. The piezoelectric/electrostrictive device further includes at least one beam section extending from the inner wall of the movable section to the inner wall of the fixing section.

8 Claims, 23 Drawing Sheets

OTHER PUBLICATIONS

Yoshikazu Soeno, et al., "Piezoelectric Piggy–Back Microactuator for Hard Disk Drive," IEEE Transactions on Magnetics, vol. 35, No. 2, Mar. 1999, pp 983–987.

S. Koganezawa, et al., "Dual–stage Actuator System for Magnetic Disk Drives Using a Shear Mode Piezoelectric Microactuator," IEEE Transactions on Magnetics, vol. 35, No. 2, Mar. 1999, pp 998–992.

* cited by examiner

PIEZOELECTRIC/ELECTROSTRICTIVE DEVICE AND METHOD OF MANUFACTURING SAME

BACKGROUND OF THE INVENTION

Field of the Invention

The present invention relates to a piezoelectric/electrostrictive device that is provided with a movable section to be operated on the basis of a displacement action of a piezoelectric/electrostrictive element, or a piezoelectric/electrostrictive device that is capable of detecting displacement of a movable section by the aid of a piezoelectric/electrostrictive element, and a method of producing the same. In particular, the invention relates to a piezoelectric/electrostrictive device that is excellent in strength, shock resistance, and moisture resistance and that makes it possible to efficiently operate a movable section to a great extent, and a method of producing the same.

BACKGROUND OF THE INVENTION

Recently, a displacement element, which makes it possible to adjust the optical path length and the position in an order of submicron, is demanded, for example, in the fields of optics, magnetic recording, and precision machining. Development is advanced for the displacement element based on the use of the displacement brought about by the inverse piezoelectric effect or the electrostrictive effect caused when a voltage is applied to a piezoelectric/electrostrictive material (for example, a ferroelectric material).

As shown in FIG. 23, for example, those hitherto disclosed as such a displacement element include a piezoelectric actuator comprising a fixing section 204, a movable section 206, and a beam section 208 for supporting the fixing and movable sections, which are formed integrally with a hole 202 provided through a plate-shaped member 200 composed of a piezoelectric/electrostrictive material and with an electrode layer 210 provided on the beam section 208 (see, for example, Japanese Laid-Open Patent Publication No. 10-136665).

The piezoelectric actuator is operated such that when a voltage is applied to the electrode layer 210, the beam section 208 makes expansion and contraction in a direction along a line obtained by connecting the fixing section 204 and the movable section 206 in accordance with the inverse piezoelectric effect or the electrostrictive effect. Therefore, the movable section 206 can perform circular arc-shaped displacement or rotational displacement in the plane of the plate-shaped member 200.

On the other hand, Japanese Laid-Open Patent Publication No. 63-64640 discloses a technique in relation to an actuator based on the use of a bimorph. In this Substitute specification paragraphs technique, the electrodes of the bimorph actuator are provided in a divided manner. The actuator is driven due to the selection of the divided electrodes, and thus highly accurate positioning is performed at a high speed. JP '640 discloses a structure (especially in FIG. 4) in which, for example, two opposed bimorphs are used.

However, the piezoelectric actuator described above involves a problem that the amount of operation of the movable section 206 is small, because the displacement in the direction of extension and contraction of the piezoelectric/electrostrictive material (i.e., in the in-plane direction of the plate-shaped member 200) is transmitted to the movable section 206 as it is.

Since all the parts of the piezoelectric actuator are made of piezoelectric/electrostrictive materials, which are fragile materials having a relatively heavy weight, the mechanical strength is low, and the piezoelectric actuator is inferior in handling performance, shock resistance, and moisture resistance. Furthermore, the piezoelectric actuator itself is heavy, and its operation tends to be affected by harmful vibrations (for example, residual vibration and noise vibration during high speed operation). In particular, the piezoelectric actuator has a weakness for torsion.

Then, a method may be adopted which increases the strength and the resonant frequency by thickening a beam portion, for example, in order to improve stiffness. However, displacement and a response speed are significantly deteriorated due to the improvement of stiffness.

SUMMARY OF THE INVENTION

The present invention has been made taking the foregoing problems into consideration, and an object thereof is to provide a piezoelectric/electrostrictive device and a method for manufacturing the same. According to the piezoelectric/electrostrictive device of the present invention, it is possible to obtain a displacement element which is scarcely affected by harmful vibration during operation and capable of high speed response with high mechanical strength while being excellent in handling performance, shock resistance, and moisture resistance, making it possible to allow a reliable displacement operation in a two-dimensional plane and improve a resonance frequency and the displacement operation. Further, according to the piezoelectric/electrostrictive device of the present invention, it is possible to obtain a sensor element which accurately detects vibration of a movable section.

According to the present invention, a piezoelectric/electrostrictive device has a pair of mutually opposing thin plate sections, a movable section, and a fixing section for supporting the thin plate sections and the movable section. The piezoelectric/electrostrictive device includes one or more piezoelectric/electrostrictive elements arranged on at least one thin plate section of the pair of thin plate sections. A hole is formed by both inner walls of the pair of thin plate sections, an inner wall of the movable section, and an inner wall of the fixing section.

The piezoelectric/electrostrictive device also includes at least one beam section provided from the inner wall of the movable section to the inner wall of the fixing section.

Since the beam section is provided from the inner wall of the movable section to the inner wall of the fixing section, the rigidity and the torsional strength of the piezoelectric/electrostrictive device is improved without increasing the thickness of the thin plate sections. Further, it is possible to realize a high resonance frequency. Furthermore, since the thickness of the thin plate section is not necessarily increased, the material characteristics of the piezoelectric/electrostrictive device formed with the thin plate sections are not deteriorated. Accordingly, it is possible to prevent a decrease in displacement.

Furthermore, since the piezoelectric/electrostrictive device has a displacement mode in which the movable section is moved in substantially parallel, the decrease in displacement due to the provision of the beam section is small, and the strength is advantageously increased. In particular, a structure having a resistance against lateral stress and torsional stress on the thin plate section is obtained.

As described above, in the piezoelectric/electrostrictive device of the invention, the control of the rigidity can be finely adjusted by changing the number, width, and thickness of the beam section without affecting the piezoelectric/electrostrictive element. In particular, torsion is suppressed owing to the provision of the beam section, and the displacement mode substantially in a two-dimensional plane can be conducted for the displacement operation.

The movable section, the fixing section, and the thin plate sections can be made of ceramics or metal. That is, each of the components may be made of a ceramic material, or each of the components may be made of a metal material. Alternatively, each of the components may be constructed to have a hybrid structure obtained by combining those produced from materials of ceramics and metal.

Furthermore, when the plane of the thin plate section where the piezoelectric/electrostrictive element is formed is designated as a side surface of the thin plate section, and the length in the direction of the minor side of the side surface of the thin plate section is designated as a width of the thin plate section, it is preferable from the standpoint of the contribution ratio of rigidity that the width of the beam section is ⅕ or more, and more preferably from ⅓ to ¼, of the width of the thin plate section.

Furthermore, when the plane of the thin plate section where the piezoelectric/electrostrictive element is formed is designated as a side surface of the thin plate section, and the length in the direction of the major side of the side surface of the thin plate section is designated as a length Le of the thin plate section, it is preferable that the ratio (Le/Tb) of the length of the thin plate section to the total thickness of the beam section (Tb) is from 5 to 200.

The thin plate sections, the movable section, and the fixing section may comprise an integrated ceramic substrate formed by co-firing a ceramic green laminate, followed by cutting off unnecessary portions. Further, the piezoelectric/electrostrictive elements may be of a film form and integrated with the ceramic substrate by firing.

Moreover, the piezoelectric/electrostrictive elements may have a piezoelectric/electrostrictive layer and a pair of electrodes formed on the piezoelectric/electrostrictive layer. The piezoelectric/electrostrictive element may have a piezoelectric/electrostrictive layer and a pair of electrodes formed on both sides of the piezoelectric/electrostrictive layer, and one electrode of the pair of electrodes may be formed on at least the thin plate section. In this arrangement, the vibration caused by the piezoelectric/electrostrictive element can be efficiently transmitted via the thin plate section to the movable section or the fixing section. Thus, it is possible to improve the response performance. Further, it is preferable that the piezoelectric/electrostrictive elements are constructed by laminating a plurality of the piezoelectric/electrostrictive layers and the pairs of electrodes.

As described above, according to the present invention, it is possible to obtain a displacement element which is scarcely affected by harmful vibration during operation and capable of high speed response with high mechanical strength while being excellent in handling performance, shock resistance, and moisture resistance, making it possible to allow a reliable displacement operation in a two-dimensional plane and improve a resonance frequency and the displacement operation. Further, it is possible to obtain a sensor element which accurately detects vibration of a movable section. According to the invention, the hole may be filled with a gel-like material.

According to the present invention, a method is provided for producing a piezoelectric/electrostrictive device having a pair of mutually opposing thin plate sections, a movable section, and a fixing section for supporting the thin plate sections and the movable section. The piezoelectric/electrostrictive device includes one or more piezoelectric/electrostrictive elements arranged on at least one thin plate section of the pair of thin plate sections, and a hole is formed by both inner walls of the pair of thin plate sections, an inner wall of the movable section, and an inner wall of the fixing section.

The method includes the step of cutting off a predetermined portion, after forming the piezoelectric/electrostrictive elements on at least the thin plate sections, to produce the piezoelectric/electrostrictive device having at least one beam section from the inner wall of the movable section to the inner wall of the fixing section.

The phrase "after forming the piezoelectric/electrostrictive elements" referred to herein indicates a state in which at least the piezoelectric/electrostrictive layer is formed on the thin plate section. As for the electrode to be formed after the formation of the piezoelectric/electrostrictive layer, the electrode may be formed after conducting cutoff for forming the movable section or the fixing section that have mutually opposing end surfaces.

Further, according to the present invention, a method is provided for producing a piezoelectric/electrostrictive device having a pair of mutually opposing thin plate sections, a movable section, and a fixing section for supporting the thin plate sections and the movable section. The piezoelectric/electrostrictive device includes one or more piezoelectric/electrostrictive elements arranged on at least one thin plate section of the pair of thin plate sections, and a hole is formed by both inner walls of the pair of thin plate sections, an inner wall of the movable section, and an inner wall of the fixing section.

The method includes the steps of producing a ceramic laminate by firing a ceramic green laminate containing first ceramic green sheets and second ceramic green sheets for constituting the thin plate sections integrally, the first ceramic green sheets each having a window for forming at least the hole and one or more beam sections. The piezoelectric/electrostrictive elements are formed on a part of an outer surface of the ceramic laminate for constituting the thin plate sections.

A piezoelectric/electrostrictive device having at least one beam section from the inner wall of the movable section to the inner wall of the fixing section is then produced by cutting at least once the ceramic laminate having the piezoelectric/electrostrictive element.

According to the above production methods, it is possible to obtain a displacement element which is scarcely affected by harmful vibration during operation and capable of high speed response with high mechanical strength while being excellent in handling performance, shock resistance, and moisture resistance, making it possible to allow a reliable displacement operation in a two-dimensional plane and improve a resonance frequency and the displacement operation. Further, it is possible to obtain a sensor element which accurately detects vibration of a movable section.

In the production methods, the exposure of the hole can be also performed in the cutting step by cutting the ceramic laminate. In this case, the movable section or the fixing section having opposing end surfaces, and the hole can be made simultaneously. However, the movable section or the fixing section and the hole can also be made separately.

Therefore, the piezoelectric/electrostrictive device according to the present invention can be utilized as the active device including, for example, vibrators, resonators, oscillators, and discriminators for the communication and the power generation, various transducers, various actuators, frequency region functional parts (filters), transformers, as well as the sensor element for various sensors including, for example, ultrasonic sensors, acceleration sensors, angular velocity sensors, shock sensors, and mass sensors. Especially, the piezoelectric/electrostrictive device according to the present invention can be preferably utilized for various actuators to be used as the mechanism for adjusting the displacement and positioning and for adjusting the angle of various precision parts of optical instruments and precision mechanical equipment.

The above and other objects, features, and advantages of the present invention will become more apparent from the following description when taken in conjunction with the accompanying drawings in which a preferred embodiment of the invention is shown by way of illustrative example.

DETAILED DESCRIPTION OF THE INVENTION

It is noted that the piezoelectric/electrostrictive device conceptually includes the element for mutually converting the electric energy and the mechanical energy by the aid of the piezoelectric/electrostrictive element. Therefore, the piezoelectric/electrostrictive device is most suitably used as the active element such as for various actuators and vibrators, especially as the displacement element based on the use of the displacement brought about by the inverse piezoelectric effect or the electrostrictive effect. Additionally, the piezoelectric/electrostrictive device is also suitably used as the passive element such as for acceleration sensor elements and shock sensor elements.

The terms piezoelectric/electrostrictive device and piezoelectric/electrostrictive element mean a piezoelectric and/or electrostrictive device and a piezoelectric and/or electrostrictive element, respectively.

Figure 1:
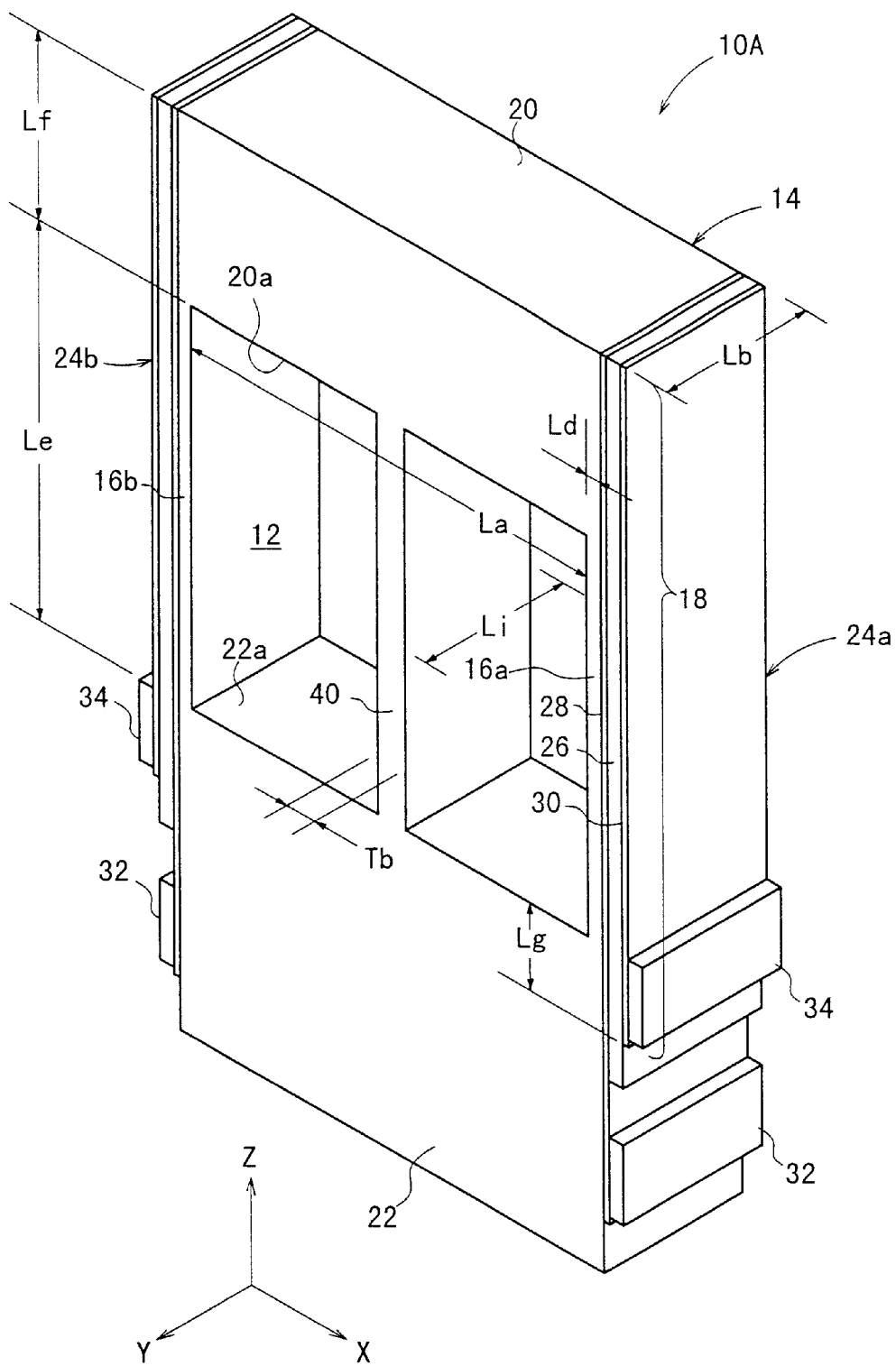
FIG. 1 shows a perspective view illustrating an arrangement of a piezoelectric/electrostrictive device according to a first embodiment.

As shown in FIG. 1, a piezoelectric/electrostrictive device 10A according to a first embodiment has a substrate 14 which has a rectangular parallelepiped-shaped configuration as a whole and which has holes 12 provided at an approximately central portion in the major axis direction thereof.

The substrate 14 comprises a pair of mutually opposing thin plate sections 16a and 16b, a movable section 20, and a fixing section 22 for supporting the pair of thin plate sections 16a and 16b and the movable section 20, and a piezoelectric/electrostrictive element 24a is formed at least a part of the thin plate section 16a and a piezoelectric/electrostrictive element 24b is formed at least a part of the thin plate sections 16b. The surfaces of the thin plate sections 16a and 16b where the piezoelectric/electrostrictive elements 24a and 24b are formed are designated as the side surfaces of the thin plate sections 16a and 16b.

Those usable as the substrate 14 include a structure comprising ceramics or metal as a whole, and a hybrid structure obtained by combining products produced with materials of ceramics and a metal.

Those applicable for the substrate 14 include, for example, a structure, in which respective parts are bonded to one another with an adhesive such as organic resin, glass or the like, a ceramic integrated structure which is obtained by firing and integrating a ceramic green laminate into one unit, and a metal integrated structure integrated by brazing, soldering, eutectic bonding, or welding into one unit. Preferably, it is desirable to construct the substrate 14 with a ceramic laminate integrated into one unit by firing a ceramic green laminate.

The time-dependent change of state scarcely occurs in the integrated product of ceramic, because no adhesive exists at joined portions between the respective parts, and therefore, the reliability of the joined portion is high, giving a structure which is advantageous to ensure the rigidity. Additionally, the integrated product of ceramic can be produced with ease by means of laminating ceramic green sheets as described later.

The piezoelectric/electrostrictive elements 24a and 24b are prepared as separate members as described later, and the prepared piezoelectric/electrostrictive elements 24a and 24b are affixed to the substrate 14 with an adhesive, such as organic resin or glass, or by means of brazing, soldering or eutectic bonding. Alternatively, the piezoelectric/electrostrictive elements 24a and 24b are directly formed on the substrate 14 by using the film formation method not by using the adhesion method described above.

The piezoelectric/electrostrictive device 10A includes the holes 12 having, for example, a rectangular configuration, which is formed by both inner walls of the pair of thin plate sections 16a and 16b, an inner wall 20a of the movable section 20, and an inner wall 22a of the fixing section 22. It is constructed such that the movable section 20 is displaced in accordance with the driving of the piezoelectric/electrostrictive element 24a and/or 24b, or the displacement of the movable section 20 is detected by the piezoelectric/electrostrictive element 24a and/or 24b.

Each of the piezoelectric/electrostrictive elements 24a and 24b comprises a piezoelectric/electrostrictive layer 26, and a pair of electrodes 28 and 30 formed on both sides of the piezoelectric/electrostrictive layer 26. A first electrode 28 of the pair of electrodes 28 and 30 is formed at least on each of the pair of thin plate sections 16a and 16b.

In the embodiment shown in FIG. 1, respective forward end surfaces of the pair of electrodes 28 and 30 and the piezoelectric/electrostrictive layer 26 for constructing the piezoelectric/electrostrictive element 24a and 24b are substantially aligned, and a substantial driving portion 18 of the piezoelectric/electrostrictive element 24a and 24b (portion, at which the pair of electrodes 28 and 30 are overlapped with each other with the piezoelectric/electrostrictive layer 26 interposed therebetween) is continuously formed over a region from the forward end of the movable section 20 to a part of the outer circumferential surface of the fixing section 22.

In the piezoelectric/electrostrictive device 10A of the first embodiment, as shown in FIG. 1, one beam section 40 is formed from the inner wall 20a of the movable section 20 to the inner wall 22a of the fixing section 22. In the example shown in FIG. 1, when the length of the side surfaces of the thin plate sections 16a and 16b in the minor side direction is designated as the width Lb of the thin plate sections 16a and 16b, the width Li of the beam section 40 is set at the substantially same value as the width Lb of the thin plate sections 16a and 16b.

The voltage is applied to the pair of electrodes 28 and via terminals (pads) 32 and 34 of the respective electrodes 28 and 30 formed on the both side surfaces (element formation surfaces) of the fixing section 22, respectively. The respective terminals 32 and 34 are positioned in such a manner that the terminal 32 corresponding to the first electrode 28 is formed at the position deviated toward the rearward end of the fixing section 22, and the terminal 34 corresponding to the second electrode 30 disposed on the side of the external space is formed at the position deviated toward the inner wall 22a of the fixing section 22.

In this case, the piezoelectric/electrostrictive device 10A can be individually fixed by utilizing the surfaces, on which the terminals 32 and 34 are not arranged, and as a result, it is possible to obtain the high reliability for both of the fixing of the piezoelectric/electrostrictive device 10A and the electric connection between the circuit and the terminals 32 and 34. In this arrangement, the electric connection between the circuit and the terminals 32 and 34 is made, for example, by means of the flexible printed circuit (also referred to as FPC), the flexible flat cable (also referred to as FFC), and the wire bonding.

Figure 2:
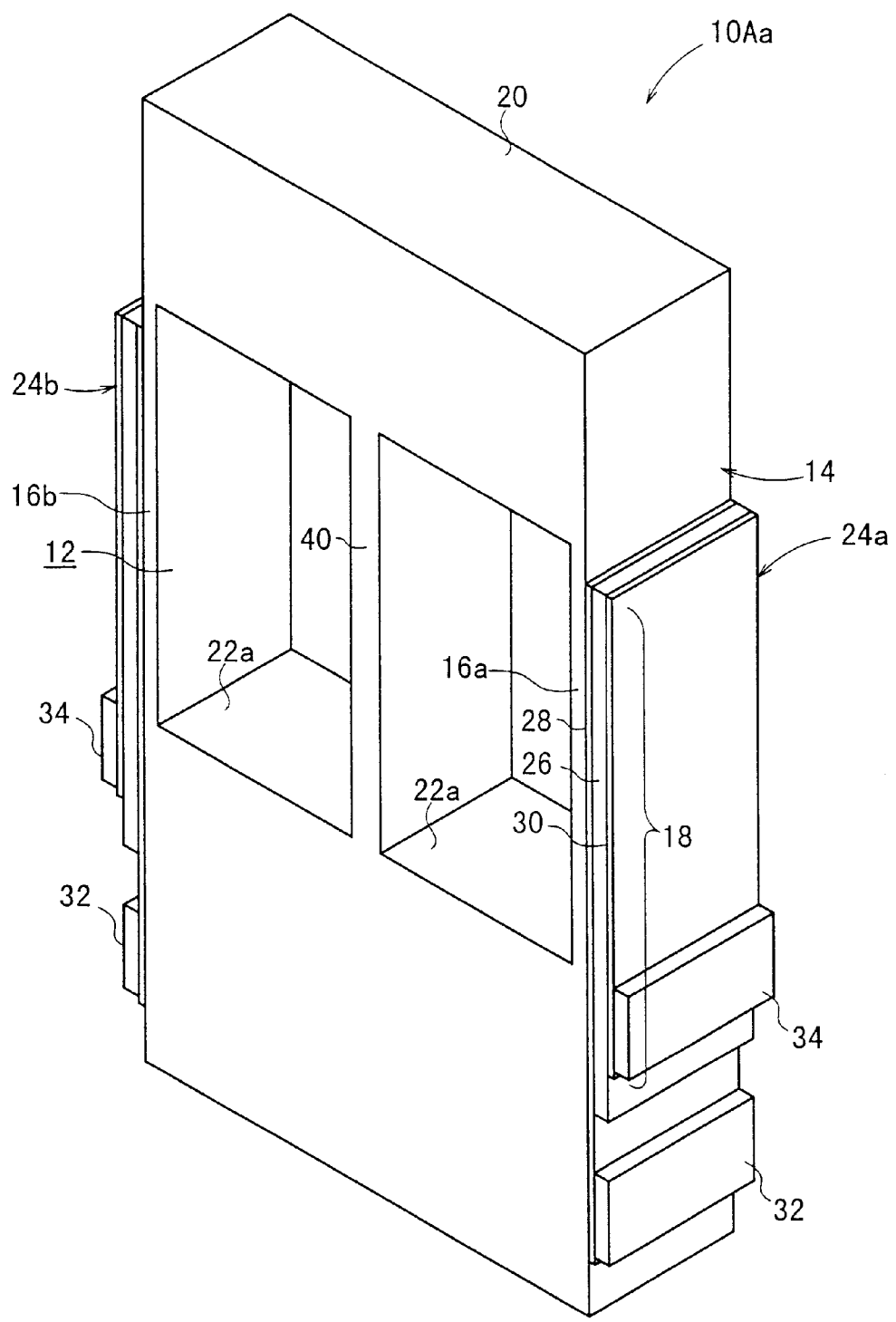
FIG. 2 shows a perspective view illustrating a first modified example of the piezoelectric/electrostrictive device according to the first embodiment.

The constitution of the piezoelectric/electrostrictive elements 24a and 24b may be, in addition to the constitution shown in FIG. 1, a piezoelectric/electrostrictive device 10Aa according to the first modified example shown in FIG. 2. In the piezoelectric/electrostrictive device 10Aa according to the first modified example, respective forward end surfaces of the pair of electrodes 28 and 30 and the piezoelectric/electrostrictive layer 26 are substantially aligned, and a substantial driving portion 18 of the piezoelectric/electrostrictive element 24a and 24b (portion, at which the pair of electrodes 28 and 30 are overlapped with each other with the piezoelectric/electrostrictive layer 26 interposed therebetween) is continuously formed over a region from a part of the outer circumferential surface of the fixing section 22 to a part of the outer circumferential surface of the thin plate sections 16a and 16b. By using the arrangement, the displacement amount of the movable section 20 can be effectively increased.

Particularly, in this example, the respective forward end surfaces of the electrodes 28 and 30 are arranged at the position deviated slightly rearward the inner wall 20a of the movable section 20. Of course, the piezoelectric/electrostrictive elements 24a and 24b may be formed in such a manner that the substantial driving portion 18 is positioned over region from a part of the movable section 20 to a part of the thin plate sections 16a and 16b.

Figure 3:
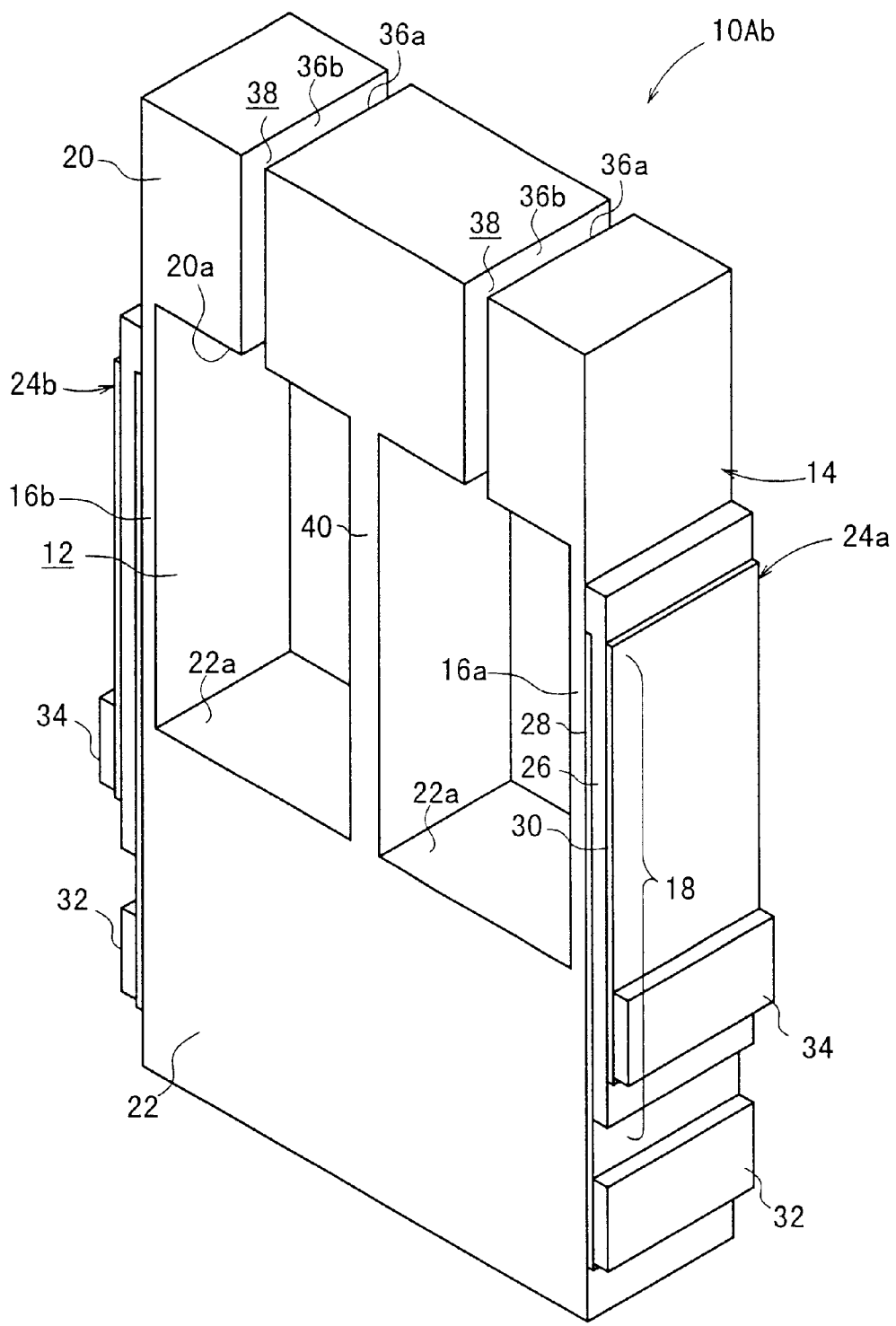
FIG. 3 shows a perspective view illustrating a second modified example of the piezoelectric/electrostrictive device according to the first embodiment.
Figure 4:
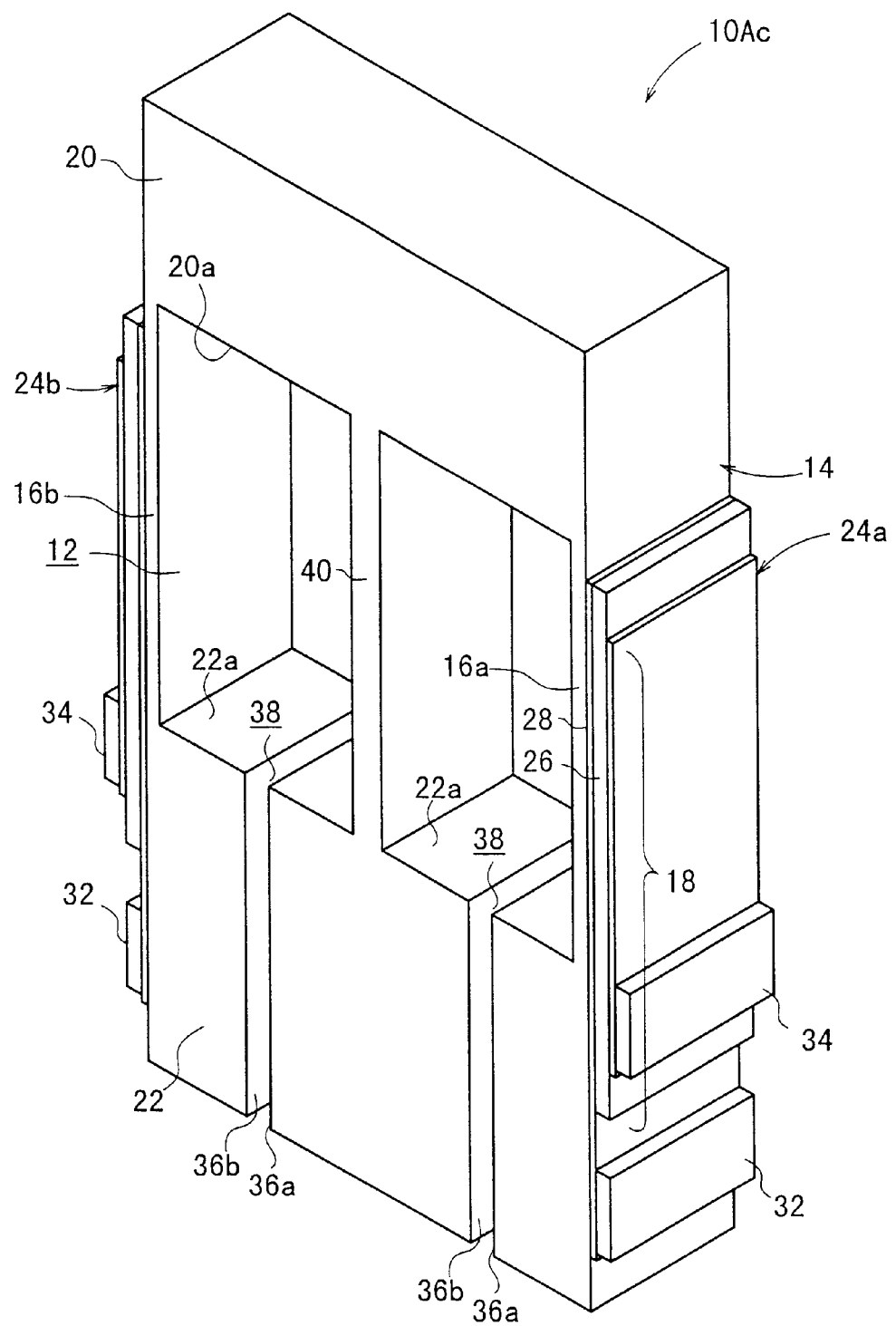
FIG. 4 shows a perspective view illustrating a third modified example of the piezoelectric/electrostrictive device according to the first embodiment.

Furthermore, in the piezoelectric/electrostrictive device 10Ab according to the second modified example shown in FIG. 3, it is possible that the respective forward end surfaces of the pair of electrodes 28 and 30 constituting the piezoelectric/electrostrictive elements 24a and 24b are substantially aligned, and only the forward end of the piezoelectric/electrostrictive layer 26 is protruded on the side of the movable section 20, or alternatively, in the piezoelectric/electrostrictive device 10Ac according to the third modified example shown in FIG. 4, it is possible that the forward end surfaces of the electrode 28 and the piezoelectric/electrostrictive layer 26 are aligned, and only the forward end surface of the electrode 30 is positioned as deviating toward the fixing section 22. These examples can advantageously increase the displacement of the movable section 20 as similar to the example shown in FIG. 2.

Particularly, in the piezoelectric/electrostrictive device 10A*b* according to the second modified example, end surfaces 36*a* and 36*b* mutually opposing one another are formed in movable section 20 as shown in FIG. 3. The example in FIG. 3 shows that the end surfaces 36*a* and 36*b* mutually opposing one another are formed in a part corresponding to the portion between the thin plate section 16*a* and the beam section 40 and in a part corresponding to the portion between the other thin plate section 16*b* and the beam section 40.

In this arrangement, because the internal residual stress generated in the piezoelectric/electrostrictive elements 24*a* and 24*b* and/or the thin plate sections 16*a* and 16*b* at the time of manufacturing process can be released by the movement of the end surfaces 36*a* and 36*b*, the displacement operation of the movable section 20 is not inhibited by the internal residual stress, and it is possible to achieve the displacement operation of the movable section 20 substantially as designed. Additionally, the release of the stress improves the mechanical strength of the piezoelectric/electrostrictive device 10A*b*.

Between the end surfaces 36*a* and 36*b*, a gap (air) 38 may intervene as shown in FIG. 3, or in alternative, a material different from the constitutional material of the movable section 20, such as a resin, may be interposed. While the foregoing example where the end surfaces 36*a* and 36*b* mutually opposing one another are provided in the movable section 20 is described, the end surfaces 36*a* and 36*b* may be formed in the fixing section 22 as the piezoelectric/electrostrictive device 10A*c* according to the third modified example (see FIG. 4).

Figure 5:
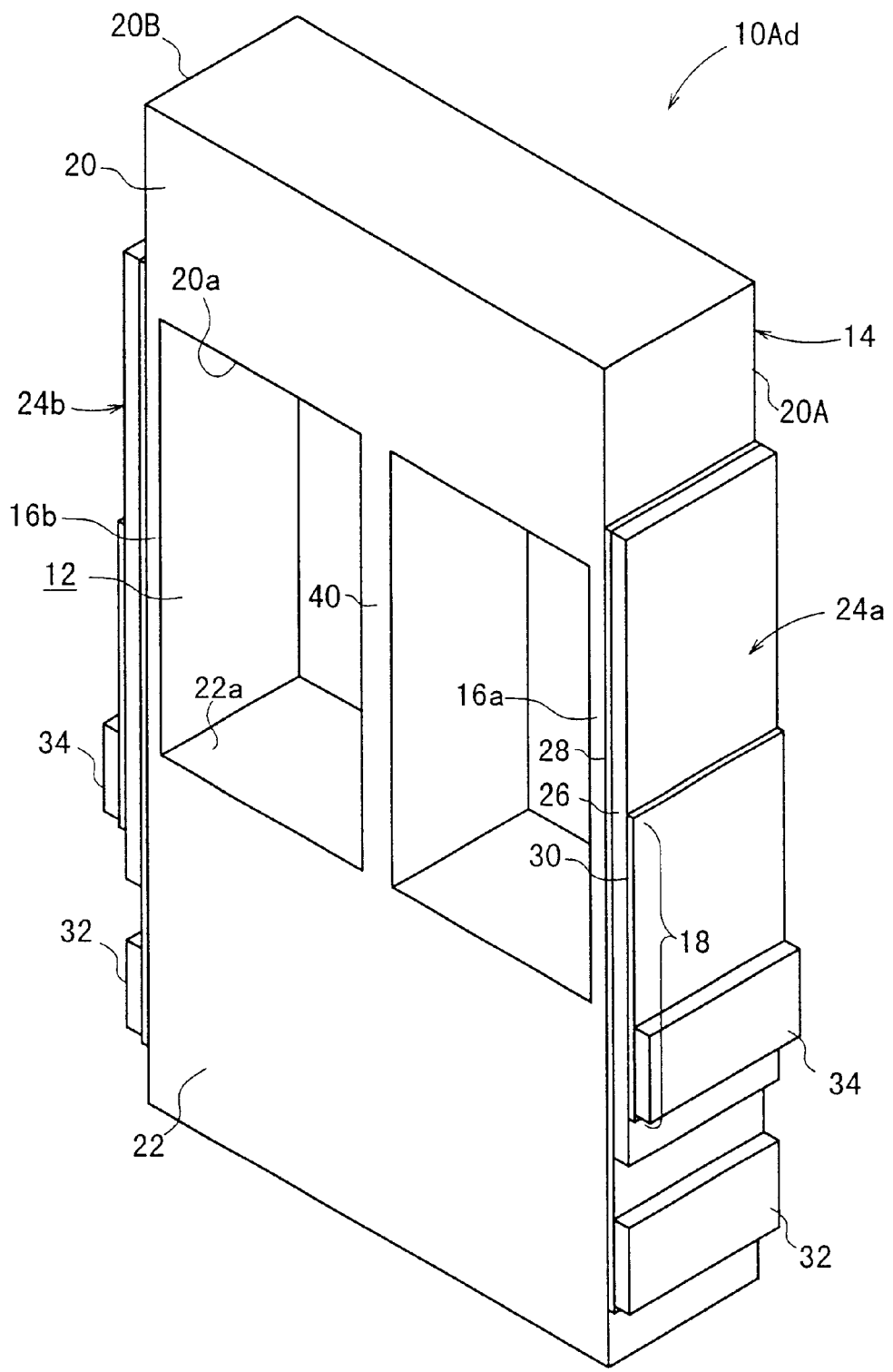
FIG. 5 shows a perspective view illustrating a fourth modified example of the piezoelectric/electrostrictive device according to the first embodiment.

Alternatively, in the piezoelectric/electrostrictive device 10A*d* according to the fourth modified example shown in FIG. 5, it is possible that the respective forward end of the first electrode 28 and the piezoelectric/electrostrictive layer 26 are extended to the side surface of the movable section 20, and the forward end of the second electrode 30 is positioned substantially centrally with respect to the longitudinal direction (Z axis direction) of the thin plate sections 16*a* and 16*b*.

While each of the piezoelectric/electrostrictive elements 24*a* and 24*b* is constituted with the piezoelectric/electrostrictive layer 26 of a one-layer structure and the pair of electrodes 28 and 30 in the foregoing examples, it is also preferable that each of the piezoelectric/electrostrictive elements 24*a* and 24*b* is constituted by laminating a plurality of the piezoelectric/electrostrictive layers 26 and pairs of electrodes 28 and 30.

Figure 6:
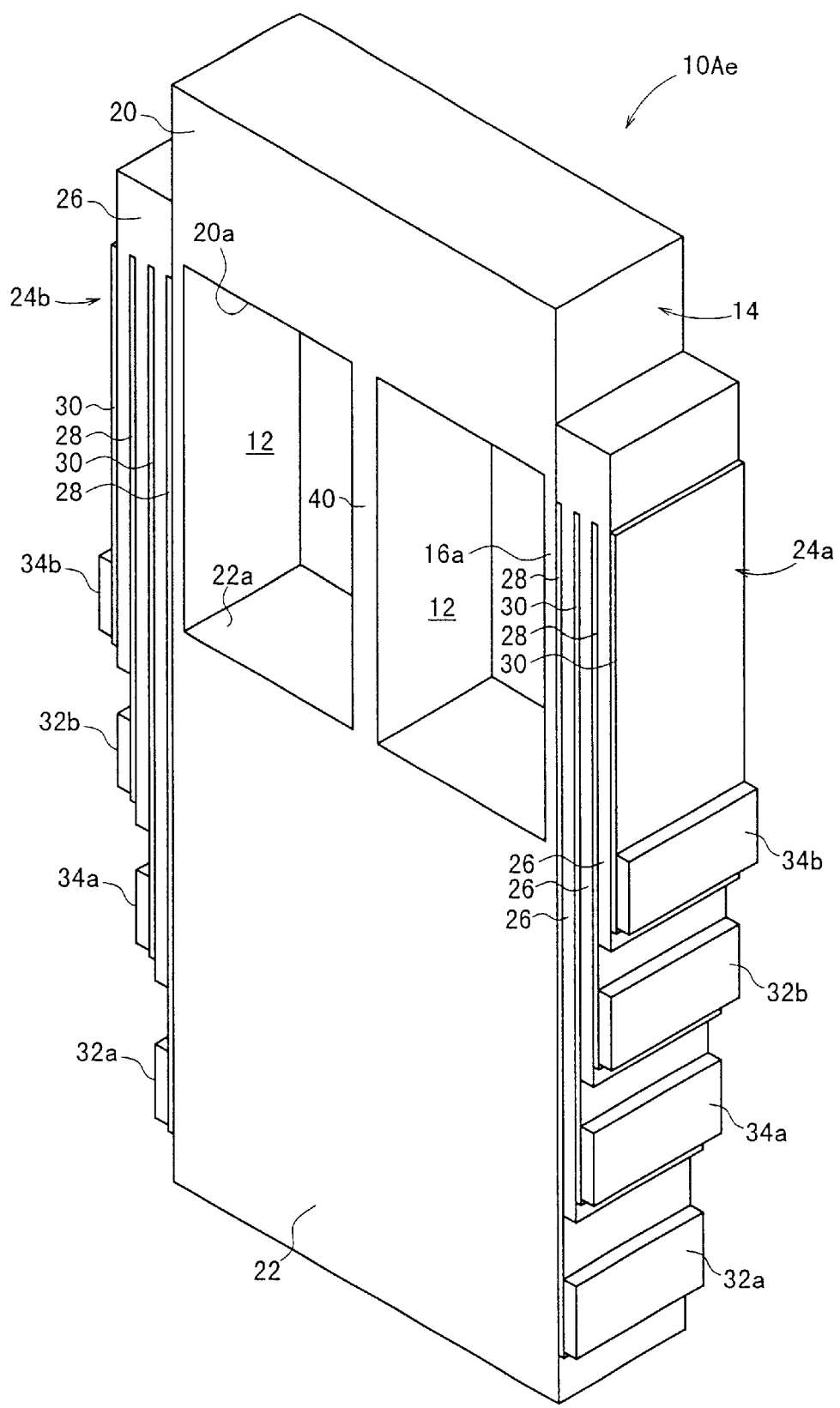
FIG. 6 shows a perspective view illustrating a fifth modified example of the piezoelectric/electrostrictive device according to the first embodiment.
Figure 7:
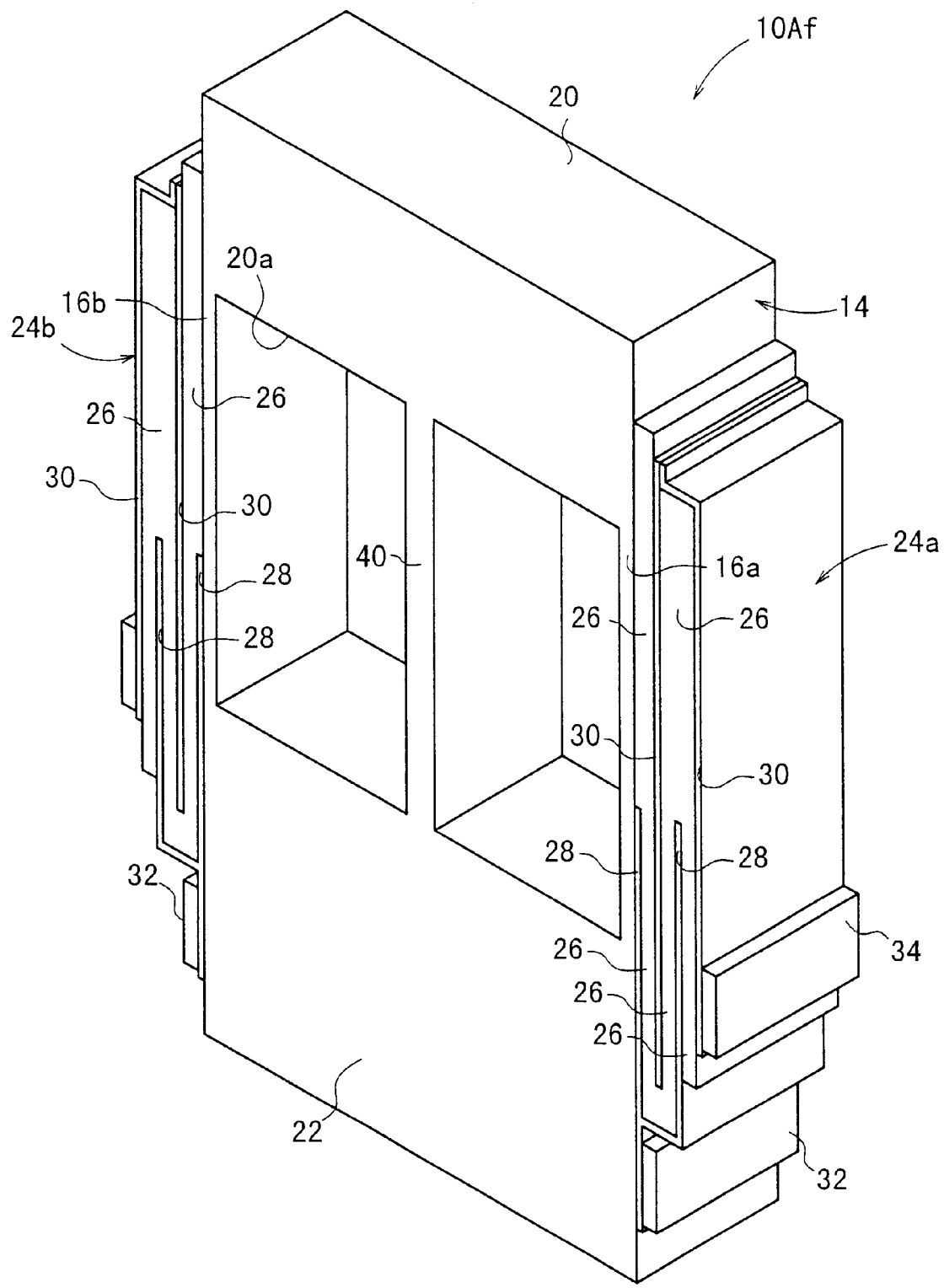
FIG. 7 shows a perspective view illustrating a sixth modified example of the piezoelectric/electrostrictive device according to the first embodiment.

For example, in the piezoelectric/electrostrictive device 10A*e* according to the fifth modified example shown in FIG. 6, the piezoelectric/electrostrictive layers 26 and pairs of electrodes 28 and 30 forms a multi-layer structure, in which the first electrodes 28 and the second electrodes 30 are alternately stacked with each other to provide the piezoelectric/electrostrictive elements 24*a*, 24*b* each having a multiple stage structure at a portion (substantial driving portion 18) at which the first electrodes 28 and the second electrodes 30 are overlapped with each other with the piezoelectric/electrostrictive layer 26 interposed therebetween. In FIG. 6, the piezoelectric/electrostrictive layer 26 has a three-layer structure, in which the first electrode 28 is formed separately on the lower surface of the first layer (side surface of the thin plate section 16*a* or 16*b*) and the upper surface of the second layer, and the second electrode 30 is formed separately on the upper surface of the first layer and the upper surface of the third layer. Furthermore, the terminals 32*a* and 32*b* are formed at both ends of the electrode 28, respectively, and the terminals 34*a* and 34*b* are formed at both ends of the second electrode 30, respectively. according to the sixth modified example shown in FIG. 7, the piezoelectric/electrostrictive layer 26 and pair of the electrodes 28 and 30 form a multi-layer structure, in which the first electrode 28 and the second electrode 30 are laminated alternately to have a cross section like a comb teeth, thereby to provide the piezoelectric/electrostrictive elements 24*a*, 24*b* each having a multiple stage structure at a portion (substantial driving portion 18) at which the first electrodes 28 and the second electrodes 30 are overlapped with each other with the piezoelectric/electrostrictive layer 26 interposed therebetween. In FIG. 7, the piezoelectric/electrostrictive layer 26 has a three-layer structure like a comb teeth. The first electrode 28 is positioned on the lower surface of the first layer (side surface of the thin plate section 16*a* or 16*b*) and the upper surface of the second layer, and the second electrode 30 is positioned on the upper surface of the first layer and the upper surface of the third layer. In this arrangement, the first electrodes 28 are connected to each other to be used commonly, and the second electrodes 30 are connected to each other to be used commonly, so as to decrease the numbers of the terminals 32 and 34 in comparison to the arrangement of FIG. 5. With the multi-layer structure of the piezoelectric/electrostrictive elements 24*a* and 24*b*, the increase in size can be suppressed.

In FIG. 6, a signal of the same potential can be applied to the first electrodes 28 and the second electrodes 30, respectively. Further, independent signals can be applied to all the electrodes 28 and 30. In the latter case, different amount of distortion can be generated in respective piezoelectric/electrostrictive layers 26 to make it possible to conduct more precise displacement control.

Figure 8:
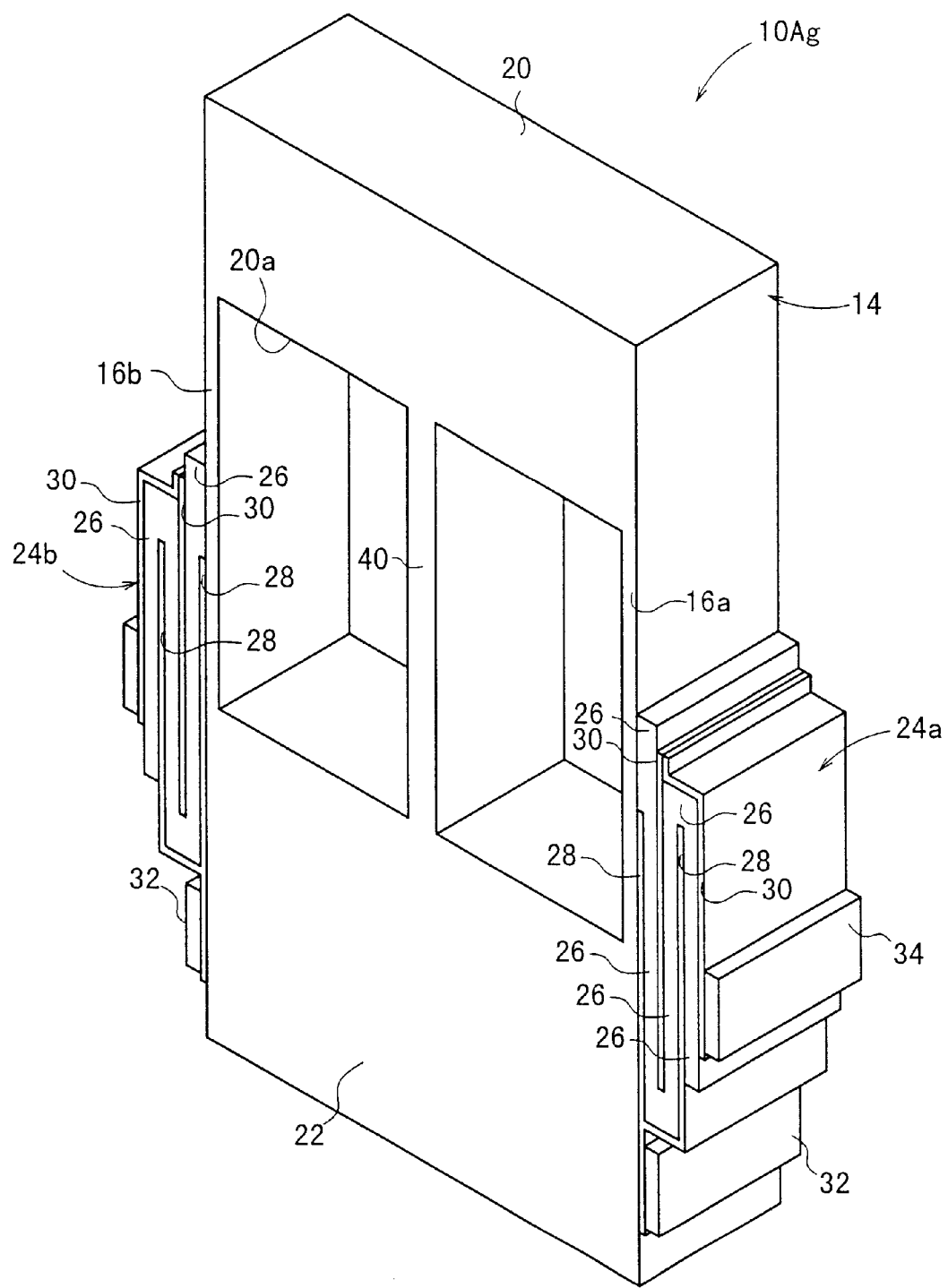
FIG. 8 shows a perspective view illustrating a seventh modified example of the piezoelectric/electrostrictive device according to the first embodiment.

In the piezoelectric/electrostrictive device 10A*g* according to the seventh modified example shown in FIG. 8, the piezoelectric/electrostrictive elements 24*a* and 24*b* are formed in such a manner that the forward ends thereof stay on the thin plate sections 16*a* and 16*b*. The example in FIG. 8 illustrates that the forward ends of the piezoelectric/electrostrictive elements 24*a* and 24*b* are positioned at the substantially central part with respect to the longitudinal direction of the thin plate sections 16*a* and 16*b*. In this arrangement, the movable section 20 can be advantageously subjected to large displacement substantially in parallel to the fixing section 22. Therefore, the strength can be increased, and the decrease in displacement can be suppressed to small by providing the beam section 40.

Figure 9:
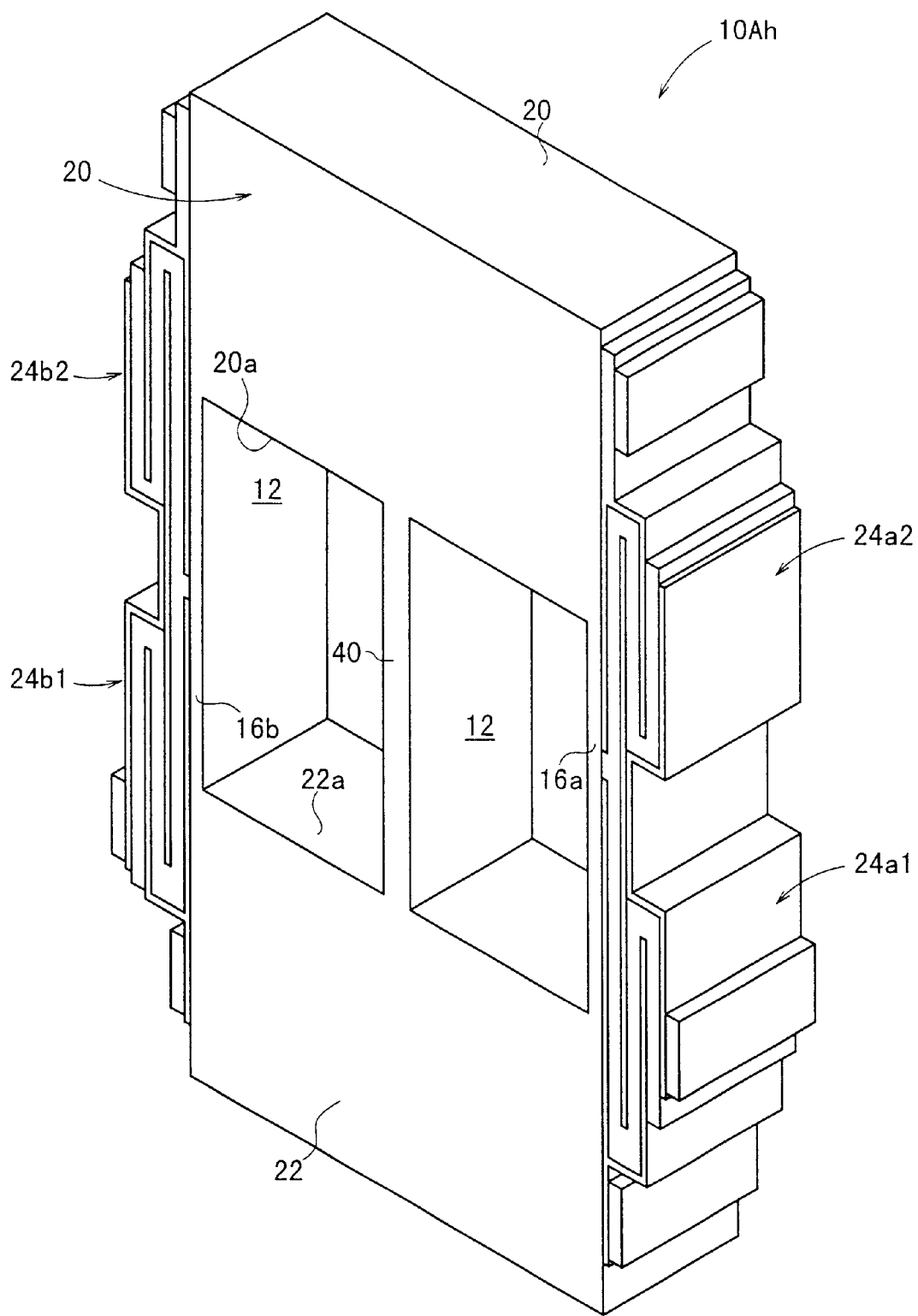
FIG. 9 shows a perspective view illustrating an eighth modified example of the piezoelectric/electrostrictive device according to the first embodiment.

In the piezoelectric/electrostrictive device 10A*h* according to the eighth modified example shown in FIG. 9, two piezoelectric/electrostrictive elements 24*a*1 and 24*b*1 each having a multi-step structure are formed over the fixing section 22 and the thin plate sections 16*a* and 16*b*, respectively, and other two piezoelectric/electrostrictive elements 24*a*2 and 24*b*2 each having the multi-step structure are formed over the movable section 20 and the thin plate sections 16*a* and 16*b*, respectively. This arrangement is preferable since the movable section 20 can be subjected to remarkably large displacement, and the device is excellent in high speed response by the effect of making the piezoelectric/electrostrictive elements 24*a* and 24*b* to have the multi-step structure and the effect of increasing the sites of action to displace the movable section 20. Furthermore, by employing the arrangement, the movable section 20 can be displaced substantially in parallel to the fixing section 22, and thus the decrease in displacement due to the influence of the beam section 40 can be substantially suppressed.

Figure 10:
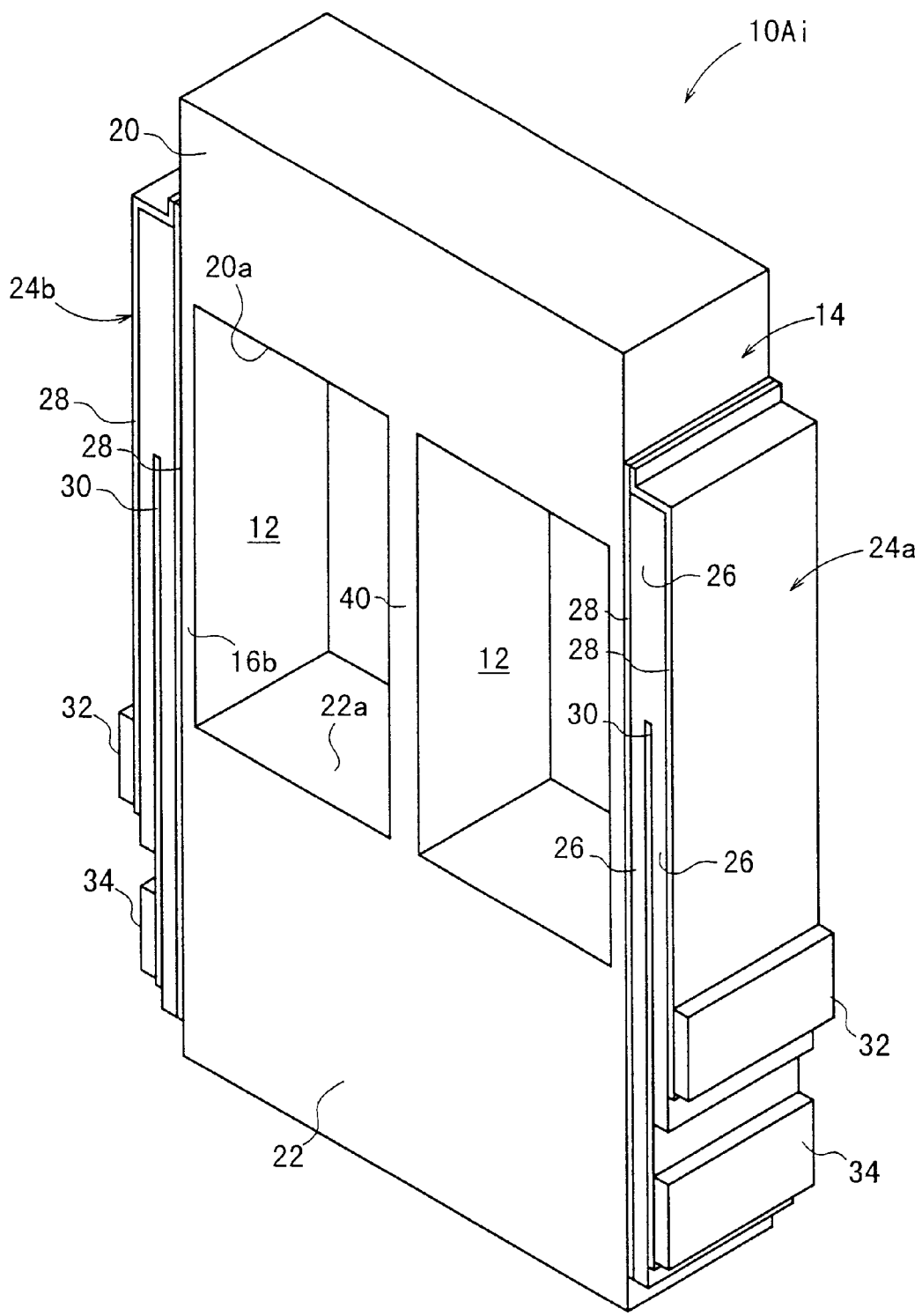
FIG. 10 shows a perspective view illustrating a ninth modified example of the piezoelectric/electrostrictive device according to the first embodiment.

According to the piezoelectric/electrostrictive device 10A*i* of the ninth modified example, as shown in FIG. 10, the piezoelectric/electrostrictive elements 24*a* and 24*b* are constructed such that the piezoelectric/electrostrictive layers 26 constitute a two-layer structure, and the electrodes 28 are configured like a comb teeth. The electrode 28 is positioned on each of the lower surface of the first layer (side surface of the thin plate section 16*a* or 16*b*) and the upper surface of the second layer, with the second electrode 30 being formed on the upper surface of the first layer.

With the multi-step structure of the piezoelectric/electrostrictive elements 24*a* and 24*b*, the power generated by the piezoelectric/electrostrictive elements 24*a* and 24*b* is increased to realize large displacement. Further, thanks to the increased rigidity of the piezoelectric/electrostrictive device 10A, the resonance frequency is increased, with the result that the high speed displacement operation can be easily realized.

Though more driving power can be obtained by increasing the number of steps, the electric power consumption also increases accordingly. Therefore, in an actual application, the number of the steps may be appropriately determined depending on the application and the condition in use. Furthermore, in the piezoelectric/electrostrictive devices 10A*e* to 10A*i* according to the fifth to ninth modified examples, even though the piezoelectric/electrostrictive elements 24*a* and 24*b* have the multi-step structure, the width (length in the Y axis direction) of the thin plate sections 16*a* and 16*b* is not changed. Therefore, the device is suitable for an actuator used for positioning and the ringing control of magnetic head of a disk drive in an extremely narrow space, for example. Furthermore, when the piezoelectric/electrostrictive elements 24*a* and 24*b* are formed over the fixing section 22 and the thin plate sections 16*a* and 16*b* and/or the thin plate sections 16*a* and 16*b* and the movable section 20, the displacement of the movable section 20 can be substantially in parallel to the fixing section 22, and therefore the increase in strength owing to the provision of the beam section 40 can be sufficiently exhibited, and the ratio of the decrease in displacement can be decreased.

Figure 11:
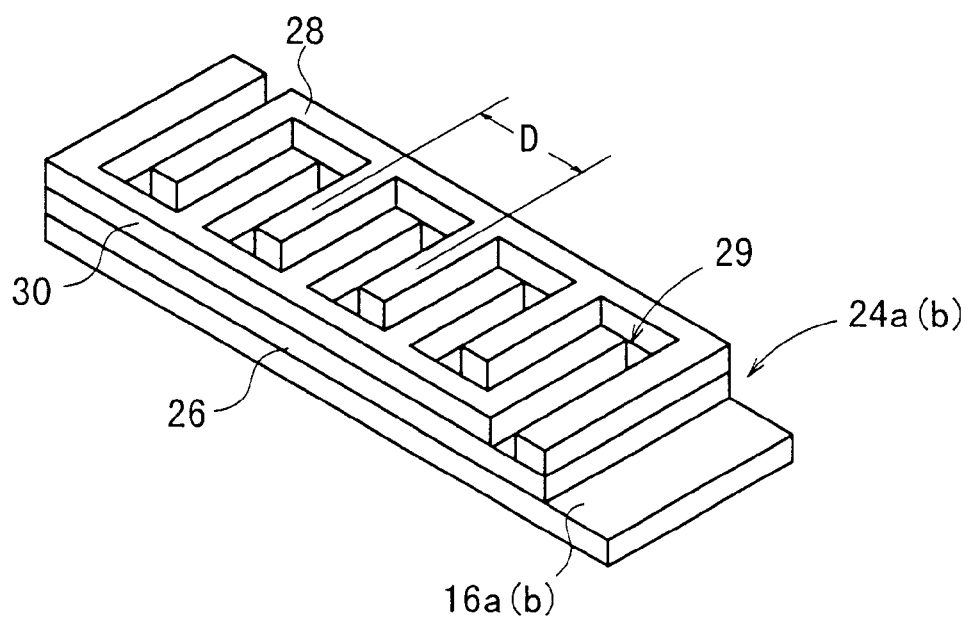
FIG. 11 shows, with partial omission, an alternative embodiment of the piezoelectric/electrostrictive element.

While the above described examples of the piezoelectric/electrostrictive elements 24*a* and 24*b* are constituted by the so-called sandwich structure where the piezoelectric/electrostrictive layer 26 is interposed between the pair of electrodes 28 and 30, the pair of electrodes 28 and 30 having a comb form may be formed on one major surface of the piezoelectric/electrostrictive layer 26 formed on the side surfaces of the thin plate sections 16*a* and 16*b* as shown in FIG. 11. Alternatively, the pair of the electrodes 28 and 30 having a comb form and the piezoelectric/electrostrictive layer 26 may be embedded on the side surfaces of the thin plate sections 16*a* and 16*b* as shown in FIG. 12.

Figure 12:
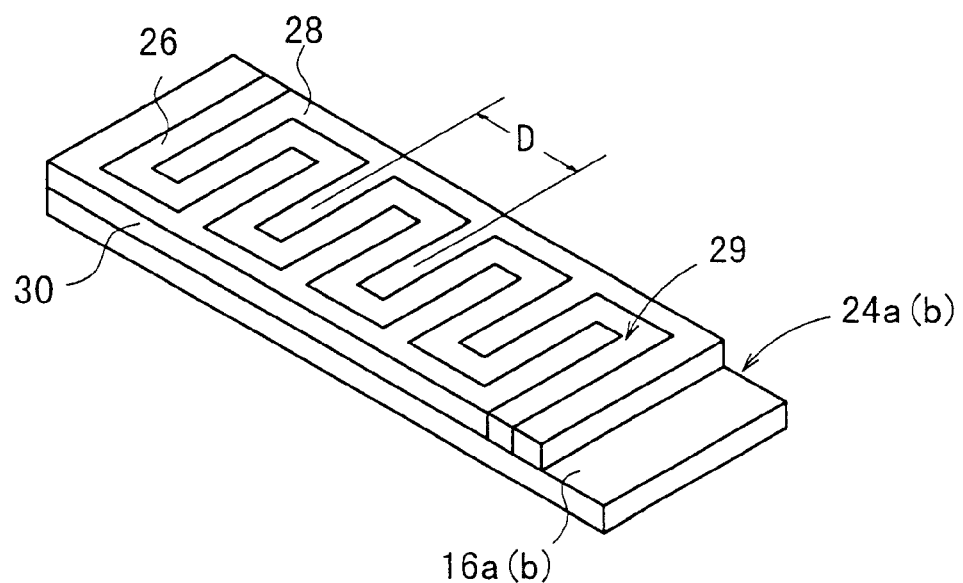
FIG. 12 shows, with partial omission, still another alternative embodiment of the piezoelectric/electrostrictive element.

In the case of the structure shown in FIG. 11, there is an advantage in that the electric power consumption can be suppressed to small, and in the case of the structure shown in FIG. 12, the inverse piezoelectric effect in the direction of the electric field that has large generating power and large distortion can be effectively utilized, and therefore it is advantageous to generate large displacement.

Specifically, the piezoelectric/electrostrictive elements 24*a* and 24*b* shown in FIG. 11 comprise the pair of electrodes 28 and 30 having the comb structure formed on one major surface of the piezoelectric/electrostrictive layer 26, and have such a structure that the first electrode 28 and the second electrode 30 mutually oppose one another with a gap 29 having a constant width. While an example where the pair of electrodes 28 and 30 are formed on one major surface of the piezoelectric/electrostrictive layer 26 is shown in FIG. 11, the pair of electrodes 28 and 30 may be formed between the thin plate sections 16*a* and 16*b* and the piezoelectric/electrostrictive layer 26, or in alternative, the pair of electrodes 28 and 30 having the comb form are formed on the major surface of the piezoelectric/electrostrictive layer 26 and between the thin plate sections 16*a* and 16*b* and the piezoelectric/electrostrictive layer 26 respectively.

On the other hand, the piezoelectric/electrostrictive elements 24*a* and 24*b* shown in FIG. 12 comprise the pair of electrodes 28 and 30 having the comb form buried in the piezoelectric/electrostrictive layer 26, and have such a structure that the first electrode 28 and the second electrode 30 mutually oppose one another with a gap 29 having a constant width.

The piezoelectric/electrostrictive elements 24*a* and 24*b* shown in FIG. 11 and FIG. 12 can also be suitably used in the piezoelectric/electrostrictive device 10A according to the first embodiment and the like. In the case where the pair of electrodes 28 and 30 having the comb form as the piezoelectric/electrostrictive elements 24*a* and 24*b* shown in FIG. 11 and FIG. 12, the displacement of the piezoelectric/electrostrictive elements 24*a* and 24*b* can be increased by reducing the pitch D of the comb teeth of the respective electrodes 28 and 30.

Figure 13:
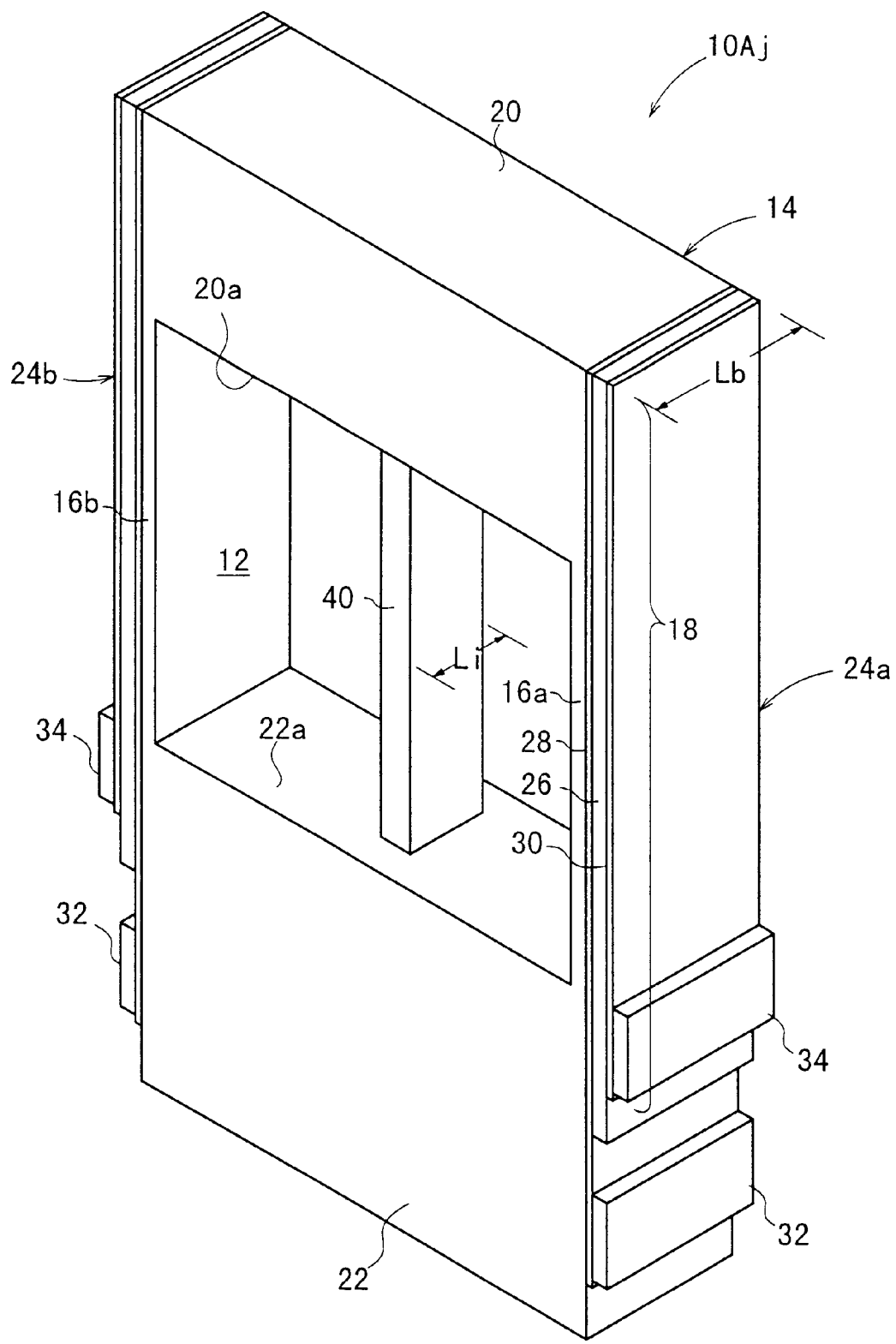
FIG. 13 shows a perspective view illustrating a tenth modified example of the piezoelectric/electrostrictive device according to the first embodiment.

In the above described example, the width Li of the beam section 40 is set at the substantially same value as the width Lb of the thin plate sections 16*a* and 16*b*, however, the width Li of the beam section 40 can be shorter than the width Lb of the thin plate sections 16*a* and 16*b* as the piezoelectric/electrostrictive device 10A*j* according to the tenth modified example shown in FIG. 13.

Figure 14:
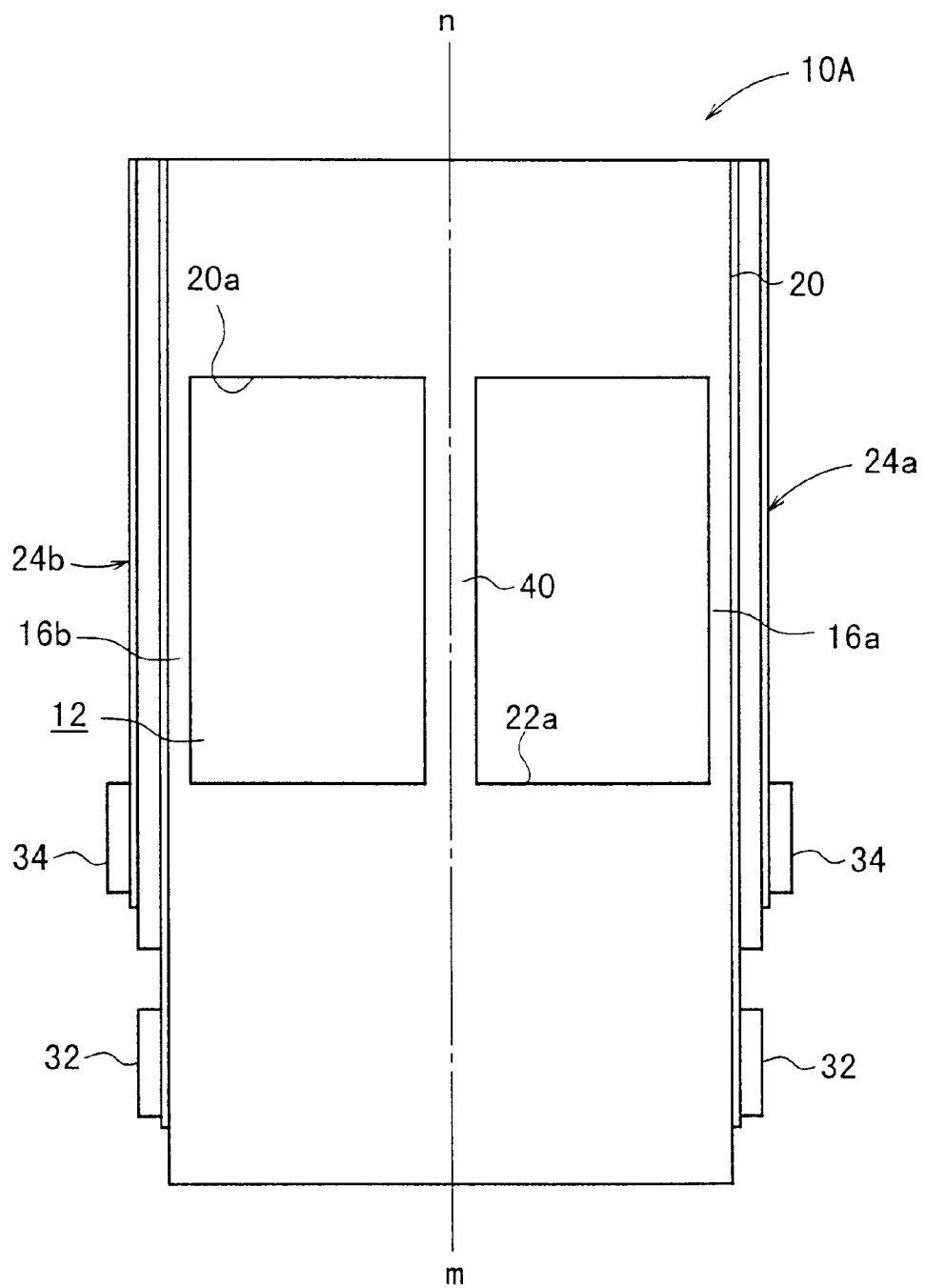
FIG. 14 illustrates a situation, in which neither of the piezoelectric/electrostrictive elements are in a displacement state in the piezoelectric/electrostrictive device according to the first embodiment.

The operation of the piezoelectric/electrostrictive device 10A according to the first embodiment will be described below. In the case where the two piezoelectric/electrostrictive elements 24*a* and 24*b* is the natural state, i.e., both the piezoelectric/electrostrictive elements 24*a* and 24*b* do not conduct displacement operation, the major axis m of the piezoelectric/electrostrictive device 10A (major axis of the fixing section) is substantially agree (coaxial) with the central axis n of the movable section 20 as shown in FIG. 14.

Figure 15A:
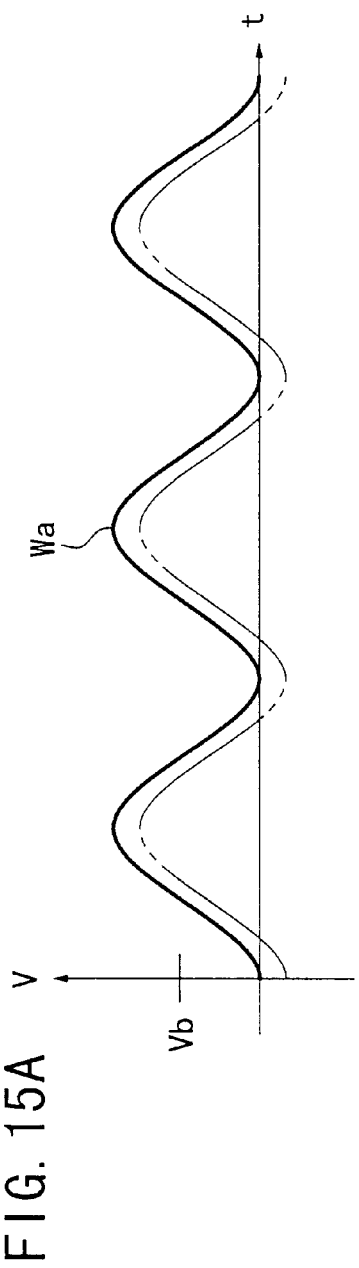
FIG. 15A shows a waveform illustrating a voltage waveform to be applied to one piezoelectric/electrostrictive element.
Figure 15B:
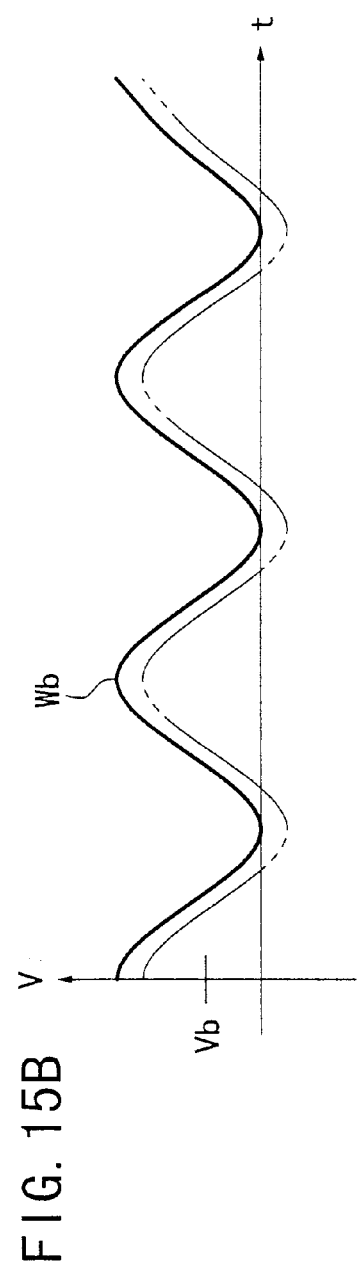
FIG. 15B shows a waveform illustrating a voltage waveform opposite to the voltage wave form shown in FIG. 15A, which is to be applied to an opposing piezoelectric/electrostrictive element.

From that state, a sine wave Wa having a predetermined bias voltage Vb is applied to the pair of electrodes 28 and 30 of one piezoelectric/electrostrictive element 24*a* as shown in FIG. 15A, and a sine wave Wb having a phase that is different from the sine wave Wa by about 180° is applied to the pair of electrodes 28 and 30 of the other piezoelectric/electrostrictive element 24*b* as shown in FIG. 15B.

Figure 16:
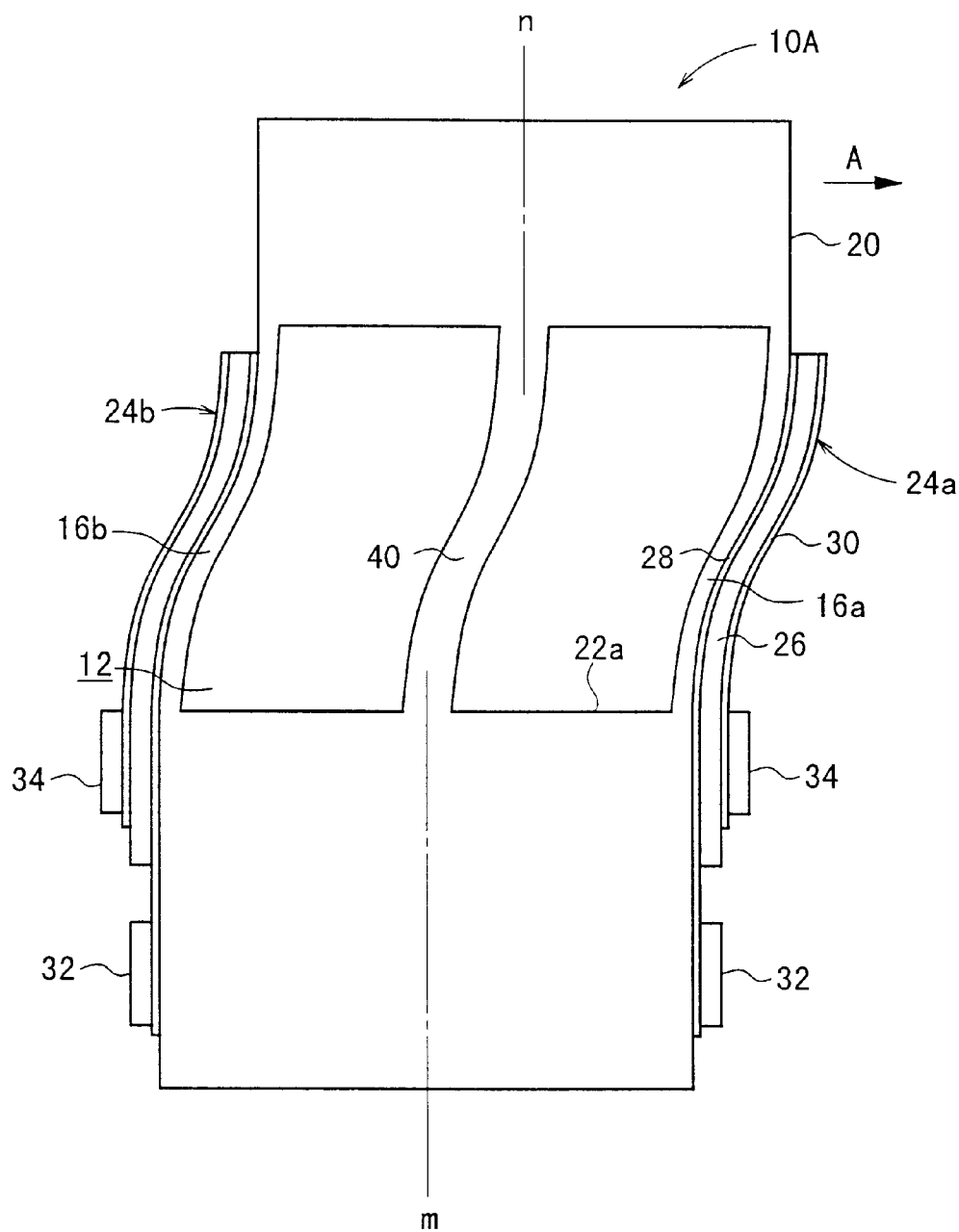
FIG. 16 illustrates a situation, in which the piezoelectric/electrostrictive element is in a state of displacement in the piezoelectric/electrostrictive device according to the first embodiment.

At the step where the maximum voltage is applied to the pair of electrodes 28 and 30 of one piezoelectric/electrostrictive element 24*a*, the piezoelectric/electrostrictive layer 26 of the one piezoelectric/electrostrictive element 24*a* suffers contractive displacement in the major surface direction. Accordingly, as shown in FIG. 16, a stress in such a direction that bends the thin plate section 16*a*, for example, in the right direction as shown by the arrow A is applied to the thin plate section 16*a*, and thus the thin plate section 16*a* is bent in the right direction. At this time, the pair of electrodes 28 and 30 of the other piezoelectric/electrostrictive element 24*b* is in the state where no voltage is applied thereto, and the other thin plate section 16b is bent in the right direction following the bending of the thin plate section 16a. As a result, the movable section 20 is displaced, for example, in the right direction with respect to the major axis m of the piezoelectric/electrostrictive device 10A. The displacement amount varies depending on the maximum value of the voltage applied to the respective piezoelectric/ electrostrictive elements 24a and 24b, and for example, when the maximum value is increased, the displacement amount is also increased.

Particularly, in the case where a piezoelectric/ electrostrictive material having a coercive electric field is applied to the material constituting the piezoelectric/ electrostrictive layer 26, it is possible that the bias voltage Vb is so adjusted that the level of the minimum value is a slightly negative level as shown in the chain lines in FIG. 15A and FIG. 15B. In this case, according to the drive of the piezoelectric/electrostrictive element, to which the negative level is applied (for example, the other piezoelectric/ electrostrictive element 24b), a stress in the direction of bending of the one thin plate section 16a is formed in the other thin plate section 16b, whereby it becomes possible to increase the displacement amount of the movable section 20. That is, by using the wave form shown by the chain lines in FIG. 15A and FIG. 15B, the piezoelectric/electrostrictive element 24a or 24b, to which the negative level is applied, advantageously supports the piezoelectric/electrostrictive elements 24a or 24b mainly conducting the displacement operation.

In the piezoelectric/electrostrictive device 10Ah according to the eighth modified example shown in FIG. 9, The voltage shown in FIG. 15A (see the sine wave Wa) is applied, for example, to the diagonally arranged piezoelectric/electrostrictive element 24a1 and the piezoelectric/electrostrictive element 24b2, and the voltage shown in FIG. 15B (see the sine wave Wb) is applied to the other piezoelectric/electrostrictive element 24a2 and the piezoelectric/electrostrictive element 24b1.

Therefore, in the piezoelectric/electrostrictive device 10A according to the first embodiment and the piezoelectric/ electrostrictive devices 10Aa to 10Aj according to the modified examples, the minute displacement of the piezoelectric/electrostrictive elements 24a and 24b is amplified to large displacement operation by utilizing the bending of the thin plate sections 16a and 16b and is transferred to the movable section 20, and thus the movable section 20 can be subjected to large displacement with respect to the major axis m of the piezoelectric/electrostrictive device 10A.

In particular, because the beam section 40 is provided from the inner wall 20a of the movable section 20 to the inner wall 22a of the fixing section 22, the rigidity of the piezoelectric/electrostrictive device 10A itself is increased without increasing the thickness Ld of the thin plate sections 16a and 16b, whereby such a structure that is strong against a force in the torsion direction can be obtained, and a high resonance frequency is also realized. Because the thickness Ld of the thin plate sections 16a and 16b is not necessarily large, the material characteristics of the piezoelectric/ electrostrictive elements 24a and 24b formed on the thin plate sections 16a and 16b are not deteriorated, and thus the decrease in displacement can be suppressed.

That is, in the piezoelectric/electrostrictive device 10A according to the first embodiment and the piezoelectric/ electrostrictive devices 10Aa to 10Aj according to the modified examples, fine adjustment of the control of the rigidity can be conducted by the number, the width and the thickness of the beam section 40 without influence on the piezoelectric/electrostrictive elements 24a and 24b. In particular, the torsion is controlled depending on the presence of the beam section 40, and the displacement operation can be conducted in the substantially two-dimensional plane as the displacement mode.

The term frequency herein means the frequency of the voltage wave form when the voltage applied to the pair of electrodes 28 and 30 is changed alternately to make horizontal displacement of the movable section 20 from side to side, and the term resonance frequency herein means the maximum frequency where the movable section 20 can follow in the predetermined vibration mode.

In the piezoelectric/electrostrictive device 10A according to the first embodiment, since the movable section 20, the thin plate sections 16a and 16b and the fixing section 22 are integrated, and all of the components are not necessarily formed with the relatively heavy piezoelectric/ electrostrictive material. Therefore, the piezoelectric/ electrostrictive device 10A is characterized by high mechanical strength and excellence in handling performance, shock resistance, and moisture resistance. The piezoelectric/electrostrictive device 10A is less subject to the influence of harmful vibration (for example, residual vibration and noise vibration on high speed operation) during operation.

In the piezoelectric/electrostrictive device 10A according to the first embodiment, the piezoelectric/electrostrictive elements 24a and 24b are constituted to have the piezoelectric/electrostrictive layer 26 and the pair of electrodes 28 and 30 formed on both sides of the piezoelectric/ electrostrictive layer 26, and the first electrode 28 of the pair of the electrodes 28 and 30 is formed on at least the outer surface of the thin plate sections 16a and 16b, whereby the vibration caused by the piezoelectric/electrostrictive elements 24a and 24b can be effectively transmitted to the movable section 20 via the thin plate sections 16a and 16b, so as to improve the response performance.

Particularly, in the piezoelectric/electrostrictive devices 10Aa to 10Ag according to the first to seventh modified examples and the piezoelectric/electrostrictive device 10Aj according to the ninth modified example, the part of the piezoelectric/electrostrictive layer 26 sandwiched by the pair of electrodes 28 and 30 (substantial driving portion 18) is continuously formed from a part of the fixing section 22 to a part of the thin plate sections 16a and 16b. In the case where the substantial driving portion 18 is formed further to a part of the movable section 20, there is a possibility that the displacement operation of the movable section 20 is restricted by the substantial driving portion 18 to fail to obtain large displacement, but in this embodiment, because the substantial driving portion 18 is formed not over both the movable section 20 and the fixing section 22, the displacement amount of the movable section 20 can be made large. In particular, it is preferable to employ the constitutions of the piezoelectric/electrostrictive devices 10Aa to 10Ac and 10Ag, since the movable section 20 can be displaced substantially in parallel to the fixing section 22, with the result that the strength of the beam section 40 can be increased, and the decrease in displacement can be suppressed to small.

On the other hand, in the case where the piezoelectric/ electrostrictive elements 24a and 24b are formed on a part of the movable section 20, it is preferable that the substantial driving portion 18 is formed to be positioned from a part of the movable section 20 to a part of the thin plate sections 16a and 16b. This is because when the substantial driving portion 18 is formed further to a part of the fixing section 22, the displacement operation of the movable section 20 is restricted as described in the foregoing. In this case, when all the first electrode 28, the second electrode 30 and the piezoelectric/electrostrictive layer 26 are formed to be positioned from a part of the movable section 20 to a part of the thin plate sections 16a and 16b, in addition to the positional relationship of the substantial driving portion 18, the movable section 20 can be displaced substantially in parallel to the fixing section 22, and thus it is preferable since the strength of the piezoelectric/electrostrictive device 10A is increased by the beam section 40, and the decrease in displacement can be suppressed to small.

A preferred constitutional embodiment of the piezoelectric/electrostrictive device 10A according to this embodiment will be described.

In order to ensure the displacement operation of the movable section 20, it is preferable that the length Lg where the substantial driving portion 18 of the piezoelectric/electrostrictive elements 24a and 24b overlaps the fixing section 22 or the movable section 20 is ½ or more of the thickness Ld of the thin plate sections 16a and 16b.

The ratio La/Lb of the distance La between the inner walls of the thin plate sections 16a and 16b (distance in the X axis direction) to the width Lb of the thin plate sections 16a and 16b is from 0.5 to 20. The ratio La/Lb is preferably from 1 to 10, and more preferably from 2 to 8. The stipulated value of the ratio La/Lb is the provision based on the finding that the displacement amount of the movable section 20 is increased, and the displacement can be predominantly obtained in the X-Z plane.

On the other hand, the ration Le/La of the length La of the thin plate sections 16a and 16b (length in the Z axis direction) to the distance La between the inner walls of the thin plate sections 16a and 16b is preferably from 0.5 to 10, and more preferably from 0.7 to 5. The stipulated value of the ratio Le/La is the provision based on the finding that the displacement amount of the movable section 20 is increased, and the displacement operation can be conducted at a high resonance frequency (i.e., a high response speed can be attained).

Therefore, in order to make the piezoelectric/electrostrictive device 10A according to the first embodiment to have a suppressed flapping displacement or vibration in the Y direction and excellence in high speed response performance with large displacement at a relatively low voltage, it is preferable that the ratio La/Lb is from 0.5 to 20, and the ratio Le/La is from 0.5 to 10, and it is more preferable that the ratio La/Lb is from 1 to 10, and the ratio Le/La is from 0.7 to 5. Furthermore, it is preferable that a gel-like material, such as silicone gel, is filled in the hole 12.

The length Lf of the movable section 20 (length in the Z axis direction) is preferably short. This is because the light weight and the increase in resonance frequency can be realized by shortening the length Lf of the movable section 20. However, in order to ensure the rigidity of the movable section 20 in the X axis direction and the displacement thereof, it is preferable that the ratio Lf/Ld to the thickness Ld of the thin plate sections 16a and 16b is 3 or more, and more preferably 5 or more.

The actual dimensions of the respective parts are determined by considering the connecting area of the movable section 20 for attachment of the parts, the connecting area for attaching the fixing section 22 to other members, the connecting area for attaching the terminals for the electrodes or the like, and the strength, the durability, the necessary displacement amount, the resonance frequency and the driving voltage of the entire piezoelectric/electrostrictive device 10A.

Specifically, the distance La between the inner walls of the thin plate sections 16a and 16b is preferably from 100 $\mu$m to 2,000 $\mu$m, and more preferably from 200 $\mu$m to 1,000 $\mu$m. The width Lb of the thin plate sections 16a and 16b is preferably from 50 $\mu$m to 2,000 $\mu$m, and more preferably from 100 $\mu$m to 500 $\mu$m. The relationship of the thickness Ld of the thin plate sections 16a and 16b to the width Lb of the thin plate sections 16a and 16b is Lb>Ld in order to effectively suppress the flapping displacement, which is the displacement component in the Y axis direction, and the thickness Ld of the thin plate sections 16a and 16b is preferably from 2 $\mu$m to 100 $\mu$m, and more preferably from 4 $\mu$m to 50 $\mu$m.

The length Le of the thin plate sections 16a and 16b is preferably from 200 to 3,000 $\mu$m, and more preferably from 300 $\mu$m to 2,000 $\mu$m. The length Lf of the movable section 20 is preferably from 50 $\mu$m to 2,000 $\mu$m, and more preferably from 100 $\mu$m to 1,000 $\mu$m.

By employing the arrangement, such an excellent effect is exhibited that while the displacement in the Y axis direction does not exceed 10% with respect to the displacement in the X direction, the low voltage driving can be conducted by appropriately adjusting the dimensional ratios and the actual dimensions within the foregoing ranges, and the displacement component in the Y axis direction can be suppressed to 5% or less. That is, the movable section 20 is displaced substantially in one direction, i.e., the X axis direction, and excellent in high speed response performance and provides large displacement with a relatively low voltage.

In the piezoelectric/electrostrictive device 10A, the shape of the device is not the conventional plate form, but the movable section 20 and the fixing section 22 exhibit a rectangular parallelepiped shape, and the pair of the thin plate sections 16a and 16b are provided in such a manner that the side surfaces of the movable section 20 and the fixing section 22 are continued, whereby the rigidity in the Y direction of the piezoelectric/electrostrictive device 10A can be selectively increased.

That is, the piezoelectric/electrostrictive device 10A can selectively generate only the operation of the movable section 20 in the plane (in the XZ plane), and the operation of the movable section 20 in the YZ plane (operation in the so-called flapping direction) can be suppressed.

In particular, the width Li of the beam section 40 is preferably ⅕ or more of the width Lb of the thin plate sections 16a and 16b from the standpoint of the contribution ratio of rigidity, and more preferably ⅓ or more. The ratio (Le/Tb) of the length Le of the thin plate sections 16a and 16b to the total thickness Tb of the beam section 40 is preferably from 5 to 200.

The respective components of the piezoelectric/electrostrictive device 10A according to the first embodiment will be described.

As described above, the movable section 20 is the portion which is operated on the basis of the driving amount of the thin plate sections 16a and 16b, and a variety of members are attached thereto depending on the purpose of use of the piezoelectric/electrostrictive device 10A. For example, when the piezoelectric/electrostrictive device 10A is used as a displacement element, a shield plate for an optical shutter or the like is attached thereto, and especially, when the piezoelectric/electrostrictive device 10A is used for the mechanism for positioning a magnetic head of a hard disk drive or for suppressing the ringing, a member required to be positioned is attached thereto, including, for example, the magnetic head, a slider provided with the magnetic head, and a suspension provided with the slider.

As described above, the fixing section 22 is the portion for supporting the thin plate sections 16a and 16b and the movable section 20. For example, when the fixing section 22 is utilized to position the magnetic head of the hard disk drive, the entire piezoelectric/electrostrictive device 10A is fixed by supporting and securing the fixing section 22, for example, to a carriage arm attached to VCM (voice coil motor) or a fixing plate or a suspension attached to the carriage arm. As shown in FIG. 1, the terminals 32 and 34 for driving the piezoelectric/electrostrictive elements 24a and 24b and other members are arranged on the fixing section 22 in some cases.

The material for constructing the movable section 20 and the fixing section 22 is not specifically limited provided that it has rigidity. However, it is possible to suitably use ceramics, to which the ceramic green sheet-laminating method is applicable as described later. Specifically, the material includes, for example, materials containing a major component of zirconia represented by fully stabilized zirconia and partially stabilized zirconia, alumina, magnesia, silicon nitride, aluminum nitride, and titanium oxide, as well as materials containing a major component of a mixture of those materials, and in view of the high mechanical strength and the high toughness, it is preferable to use a material containing a major component of zirconia, especially fully stabilized zirconia and a material containing a major component of partially stabilized zirconia. The metallic material is not limited provided that it has rigidity, and the metallic material includes, for example, stainless steel and nickel. Further, it is also possible to use engineering plastics.

As described above, the thin plate sections 16a and 16b are the portion, which are driven in accordance with the displacement of the piezoelectric/electrostrictive elements 24a and 24b. The thin plate sections 16a and 16b are the thin plate-shaped member having flexibility, and they function to amplify the expansion and contracting displacement of the piezoelectric/electrostrictive elements 24a and 24b arranged on the surface as the bending displacement and transmit the displacement to the movable section 20. Therefore, it is enough that the shape or the material of the thin plate sections 16a and 16b provides the flexibility and the mechanical strength of such a degree that it is not broken by the bending displacement. It is possible to make appropriate selection considering the response performance and the operability of the movable section 20.

It is preferable that the thickness Ld of the thin plate sections 16a and 16b is preferably about from 2 μm to 100 μm. It is preferable that the combined thickness of the thin plate sections 16a and 16b and the piezoelectric/electrostrictive elements 24a and 24b is from 7 μm to 500 μm. It is preferable that the thickness of the electrodes 28 and 30 is from 0.1 to 50 μm, and the thickness of the piezoelectric/electrostrictive layer 26 is from 3 to 300 μm. The width Lb of the thin plate sections 16a and 16b is preferably from 50 μm to 2,000 μm.

Ceramics, which is similarly used for the movable section 20 and the fixing section 22, can be preferably used as the material for constructing the thin plate sections 16a and 16b. A material containing a major component of zirconia, especially fully stabilized zirconia and a material containing a major component of partially stabilized zirconia are most preferably used because the mechanical strength is large even in the case of a thin wall thickness, the toughness is high, and the reactivity with the piezoelectric/electrostrictive layer and the electrode material is small.

When the thin plate sections 16a and 16b are made of a metallic material, it is enough that the metallic material has flexibility and the metallic material is capable of bending displacement as described above, and preferably, it is desirable that they are made of an iron-based material such as various stainless steel materials and various spring steel materials. Alternatively, it is desirable that they are made of a non-ferrous material such as beryllium copper, phosphor bronze, nickel, and nickel-iron alloy.

Those, which are fully stabilized or partially stabilized as follows, are preferably used as fully stabilized zirconia or partially stabilized zirconia as described above. That is, the compound to be used for fully stabilizing or partially stabilizing zirconia includes yttrium oxide, ytterbium oxide, cerium oxide, calcium oxide and magnesium oxide. When at least one compound of them is added and contained, zirconia is partially or fully stabilized, and as for the stabilization, the zirconia can be stabilized not only by adding one type of the compound but also by adding a combination of the compounds.

The amount of addition of each of the compounds is desirably from 1 to 30 mol %, and preferably from 1.5 to 10 mol % for yttrium oxide or ytterbium oxide; from 6 to 50 mol %, and preferably from 8 to 20 mol % for cerium oxide; and from 5 to 40 mol %, and preferably from 5 to 20 mol % for calcium oxide or magnesium oxide, and it is preferable to use yttrium oxide as a stabilizer. In this case, the addition amount of yttrium oxide is desirably from 1.5 to 10 mol %, and more preferably from 2 to 4 mol %. For example, alumina, silica, or transition metal oxide may be added as an additive of firing aid or the like in a range of from 0.05 to 20% by weight, and when the firing integration based on the film formation method is adopted as a technique for forming the piezoelectric/electrostrictive elements 24a and 24b, it is also preferable to add, for example, alumina, magnesia, and transition metal oxide as an additive.

In order to obtain the mechanical strength and the stable crystal phase, it is desirable that the average crystal grain size of zirconia is from 0.05 to 3 μm, and preferably from 0.05 to 1 μm. As described above, ceramics can be used for the thin plate sections 16a and 16b in the same manner as the movable section 20 and the fixing section 22, and preferably, it is advantageous to construct the thin plate sections 16a and 16b with a substantially identical material in view of the reliability of the joined portion and the strength of the piezoelectric/electrostrictive device 10A, in order to reduce any complicated procedure of the production.

The piezoelectric/electrostrictive elements 24a and 24b have at least the piezoelectric/electrostrictive layer 26 and the pair of electrodes 28 and 30 for applying the electric field to the piezoelectric/electrostrictive layer 26. It is possible to use, for example, piezoelectric/electrostrictive elements of the unimorph type and the bimorph type, and those of the unimorph type relating to the combination of the thin plate sections 16a and 16b are suitable for the piezoelectric/electrostrictive device 10A as described above because they are excellent in stability of the generated displacement amount and they are advantageous to realize the light weight.

For example, as shown in FIG. 1, it is possible to suitably use, for example, the piezoelectric/electrostrictive element comprising the first electrode 28, the piezoelectric/electrostrictive layer 26, and the second electrode 30 which are stacked in the layered configuration, and additionally, it is also preferable to provide the multiple stage structure as shown in FIGS. 6 to 10.

As shown in FIG. 1, the piezoelectric/electrostrictive elements 24a and 24b are preferably formed on the outer surface of the piezoelectric/electrostrictive device 10A in view of the fact that the thin plate sections 16a and 16b can be driven to a greater extent, and the piezoelectric/electrostrictive elements 24a and 24b may be formed on the inner surface of the piezoelectric/electrostrictive device 10A, i.e., on the inner wall surface of the hole 12 depending on, for example, the form of use. Alternatively, the piezoelectric/electrostrictive elements 24a and 24b may be formed both on the outer surface and on the inner surface of the piezoelectric/electrostrictive device 10A.

Piezoelectric ceramics is preferably used for the piezoelectric/electrostrictive layer 26, and it is also possible to use electrostrictive ceramics, ferroelectric ceramics, or anti-ferroelectric ceramics. However, when the piezoelectric/electrostrictive device 10A is used, for example, to position the magnetic head of the hard disk drive, because it is important to provide the linearity concerning the displacement amount of the movable section 20 and the driving voltage or the output voltage, it is preferable to use a material having small strain hysteresis, and it is also preferable to use a material having a coercive electric field of not more than 10 kV/mm.

Specifically, it is possible to use materials such as ceramics containing, for example, lead zirconate, lead titanate, lead magnesium niobate, lead nickel niobate, lead zinc niobate, lead manganese niobate, lead antimony stannate, lead manganese tungstate, lead cobalt niobate, barium titanate, sodium bismuth titanate, potassium sodium niobate, and strontium bismuth tantalate singly or in mixture.

Especially, a material containing a major component of lead zirconate, lead titanate, and lead magnesium niobate, or a material containing a major component of sodium bismuth titanate is preferably used, in order to obtain the product having a stable composition with a high electromechanical coupling factor and a piezoelectric constant and with small reactivity with the thin plate sections (ceramics) 16a and 16b during the firing of the piezoelectric/electrostrictive layer 26.

It is also preferable to use ceramics, obtained by adding to the material described above, for example, oxides of lanthanum, calcium, strontium, molybdenum, tungsten, barium, niobium, zinc, nickel, manganese, cerium, cadmium, chromium, cobalt, antimony, iron, yttrium, tantalum, lithium, bismuth, and tin singly or in mixture.

For example, when lanthanum or strontium is contained in the major components of lead zirconate, lead titanate and lead magnesium niobate, an advantage is obtained in some cases, for example, in such a way that the coercive electric field and the piezoelectric characteristic can be adjusted.

It is desirable to avoid the addition of a material such as silica, which tends to form glass. This is because the material such as silica tends to react with the piezoelectric/electrostrictive material during the heat treatment for the piezoelectric/electrostrictive layer, whereby as a result, the composition is varied, and the piezoelectric characteristic is deteriorated.

On the other hand, it is preferable that the pair of electrodes 28 and 30 of the piezoelectric/electrostrictive elements 24a and 24b are made of metal which is solid at room temperature and which is excellent in conductivity. For example, it is possible to use metal simple substance or alloy of, for example, aluminum, titanium, chromium, iron, cobalt, nickel, copper, zinc, niobium, molybdenum, ruthenium, palladium, rhodium, silver, tin, tantalum, tungsten, iridium, platinum, gold and lead. It is also preferable to use a cermet material obtained by dispersing, in the metal described above, the same material as that of the piezoelectric/electrostrictive layer 26 or the thin plate sections 16a and 16b.

The material for the electrodes 28 and 30 of the piezoelectric/electrostrictive elements 24a and 24b is selected and determined depending on the method of forming the piezoelectric/electrostrictive layer 26. For example, when the piezoelectric/electrostrictive layer 26 is formed by firing on the first electrode 28 after the first electrode 28 is formed on the thin plate sections 16a and 16b, it is necessary for the first electrode 28 to use high melting point metal such as platinum, palladium, a platinum-palladium alloy, a silver-palladium alloy and a gold-palladium alloy which does not change at the firing temperature for the piezoelectric/electrostrictive layer 26. However, because the electrode formation can be performed at a low temperature for the second electrode 30 which is formed on the piezoelectric/electrostrictive layer 26 after forming the piezoelectric/electrostrictive layer 26, it is possible for the second electrode 30 to use low melting point metal such as aluminum, gold and silver.

The thickness of the electrodes 28 and 30 also serve as a factor to considerably decrease the displacement of the piezoelectric/electrostrictive elements 24a and 24b. Therefore, it is preferable, especially for the electrode formed after the firing of the piezoelectric/electrostrictive layer 26, to use organic metal paste capable of obtaining a dense and thinner film after the firing, for example, a material such as gold resinate paste, platinum resinate paste and silver resinate paste.

The method of producing the piezoelectric/electrostrictive device 10A according to the first embodiment will be described with reference to FIGS. 17A to 19.

Ceramics is preferably used for the constitutive material for each of the members of the piezoelectric/electrostrictive device 10A according to the first embodiment of the invention. It is preferable that the constitutive elements of the piezoelectric/electrostrictive device 10A concerning the substrate 14 except for the piezoelectric/electrostrictive elements 24a and 24b, i.e., the thin plate sections 16a and 16b, the fixing section 22 and the movable section 20 are produced by using the ceramic green sheet-laminating method. On the other hand, it is preferable that the piezoelectric/electrostrictive elements 24a and 24b as well as the respective terminals 32 and 34 are produced by using the film formation method, for example, for the thin film and the thick film.

According to the ceramic green sheet-laminating method in which the respective members of the substrate 14 of the piezoelectric/electrostrictive device 10A can be formed integrally, the time-dependent change of state scarcely occurs at the joined portions of the respective members, and therefore, this method provides the high reliability of the joined portion, and it is advantageous to ensure the rigidity.

In the piezoelectric/electrostrictive device 10A according to the first embodiment, the boundary portion (joined portion) between the thin plate sections 16a and 16b and the fixing section 22 and the boundary portion (joined portion) between the thin plate sections 16a and 16b and the movable section 20 function as supporting points for expressing the displacement. Therefore, the reliability of the joined portion is an important point, which dominates the characteristic of the piezoelectric/electrostrictive device 10A.

Because the production methods described below are excellent in productivity and formability, it is possible to obtain the piezoelectric/electrostrictive device having a predetermined shape within a short period of time with good reproducibility.

A method of producing the piezoelectric/electrostrictive device 10A according to the first embodiment of the invention will be specifically explained below. The following definitions are now made. The laminate that is obtained by laminating the ceramic green sheets is defined to be the ceramic green laminate 58 (see, for example, FIG. 17B). The integrated matter that is obtained by firing the ceramic green laminate 58 is defined to be the ceramic laminate 60 (see, for example, FIG. 18). The integrated matter comprising the movable section 20, the thin plate sections 16a and 16b, and the fixing section 22 that is obtained by cutting off unnecessary portions from the ceramic laminate 60 is defined to be the ceramic substrate 14C (see FIG. 19).

In this production method, the ceramic laminate 60 is finally cut into chip units to produce a large number of piezoelectric/electrostrictive devices 10A. However, in order to simplify the explanation, description will be made principally for the case in which one individual of piezoelectric/electrostrictive device 10A is produced.

At first, for example, a binder, a solvent, a dispersing agent and a plasticizer are added and mixed with a ceramic powder such as zirconia to prepare a slurry. The slurry is subjected to a degassing treatment, and then a ceramic green sheet having a predetermined thickness is prepared in accordance with, for example, the reverse roll coater method and the doctor blade method.

Figure 17B:
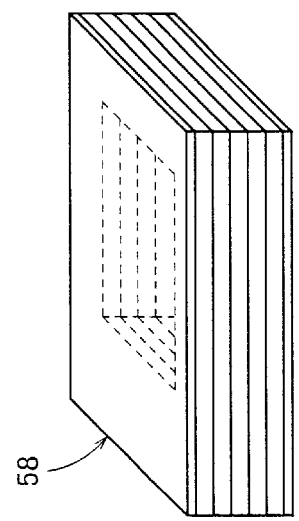
FIG. 17B illustrates a state, in which a ceramic green laminate is formed.
Figure 17A:
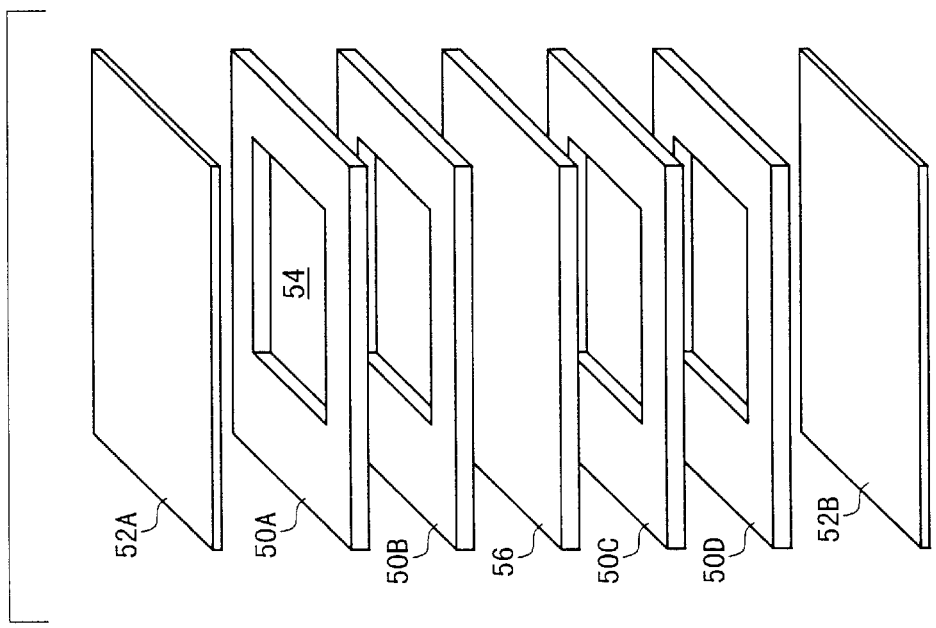
FIG. 17A illustrates a process for laminating necessary ceramic green sheets in accordance with the production method for the piezoelectric/electrostrictive device according to the first embodiment.

Subsequently, the ceramic green sheet is processed into those having various shapes as shown in FIG. 17A in accordance with, for example, the punching out based on the mold and the laser machining to obtain a plurality of ceramic green sheets 50A to 50D, 52A, 52B and 56 for forming the substrate.

The ceramic green sheets 50A to 50D, 52A, 52B and 56 include the plurality (for example, four) of ceramic green sheets 50A to 50D each of which is formed with at least a window 54 for forming the hole 12 thereafter, for example, one ceramic green sheet 56 to be formed into the beam section 40 thereafter, and the plurality (for example, two) of ceramic green sheets 52A and 52B to be formed into the thin plate sections 16a and 16b thereafter. The numbers of ceramic green sheets referred to above are persistently by way of example.

Figure 18:
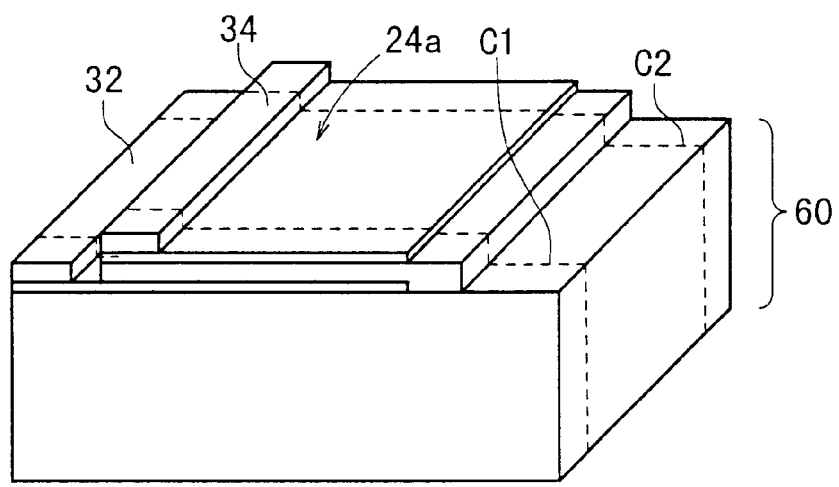
FIG. 18 illustrates a state in the production method, in which the ceramic green laminate is fired into the ceramic laminate, and then a piezoelectric/electrostrictive element is formed on the ceramic laminate.

Thereafter, as shown in FIG. 17B, the ceramic green sheets 50A to 50D, 52A, 52B and 56 are laminated and pressure-secured in such a manner that the ceramic green sheets 50A to 50D and 56 are sandwiched by the ceramic green sheets 52A and 52B, and the ceramic green sheet 56 is positioned at the center, so as to form a ceramic green laminate 58, and then the ceramic green laminate 58 is fired to obtain a ceramic laminate 60 (see FIG. 18).

There is no limitation for the number of pressure-securing steps and the sequence for the purpose of the laminating and integration into one unit. These factors can be appropriately determined depending on the structure, for example, so that the desired structure is obtained on the basis of, for example, the shape of the window 54 and the number of ceramic green sheets.

It is unnecessary that the shape of the window 54 is identical in all cases, and it can be determined depending on the desired function. There is also no limitation for the number of ceramic green sheets and the thickness of each of the ceramic green sheets.

In the pressure-securing step, it is possible to further improve the laminating performance by applying the heat. The laminating performance at the boundary of the ceramic green sheet can be improved by providing an auxiliary joining layer, for example, by applying and printing, onto the ceramic green sheet, a paste or a slurry principally containing a ceramic powder (it is preferable to use a composition which is the same as or similar to that of the ceramics used for the ceramic green sheet in order to ensure the reliability) and the binder. When the ceramic green sheets 52A and 52B are thin, it is preferable to handle them with a plastic film, especially with a polyethylene terephthalate film coated with a releasing agent based on silicone on the surface.

Subsequently, as shown in FIG. 18, the piezoelectric/electrostrictive elements 24a and 24b are formed respectively on the both surfaces of the ceramic laminate 60, i.e., on the surfaces corresponding to the surfaces, at which the ceramic green sheets 52A and 52B are laminated. Those usable as the method of forming the piezoelectric/electrostrictive elements 24a and 24b include the thick film formation method, such as the screen printing method, the dipping method, the coating method and the electrophoresis method, and the thin film formation method, such as the ion beam method, the sputtering method, the vacuum vapor deposition, the ion plating method, the chemical vapor deposition method (CVD) and the plating method.

When the piezoelectric/electrostrictive elements 24a and 24b are formed by using the film formation method as described above, the piezoelectric/electrostrictive elements 24a and 24b and the thin plate sections 16a and 16b can be integrally joined and arranged without using any adhesive, whereby it is possible to ensure the reliability and the reproducibility, and it is easy to form the stack.

In this case, it is preferable that the piezoelectric/electrostrictive elements 24a and 24b are formed by means of the thick film formation method. This is because, especially, when the piezoelectric/electrostrictive layer 26 is formed by using the thick film formation method, the film can be formed by using, for example, a paste, a slurry, a suspension, an emulsion, or a sol containing a major component of particles or powder of piezoelectric ceramics having an average particle size of from 0.01 to 5 $\mu$m, preferably from 0.05 to 3 $\mu$m, and thus it is possible to obtain good piezoelectric/electrostrictive characteristics by firing the formed film.

The electrophoresis method is advantageous in that the film can be formed at a high density with a high shape accuracy. The screen printing method is advantageous to simplify the production step because it is possible to simultaneously perform the film formation and the pattern formation.

The formation of the piezoelectric/electrostrictive elements 24a and 24b will be described. At first, the ceramic green laminate 58 is fired and integrated into one unit at a temperature of from 1,200 to 1,600° C. to obtain the ceramic laminate 60, and then the first electrodes 28 are printed and fired at predetermined positions on the both surfaces of the ceramic laminate 60. Subsequently, the piezoelectric/electrostrictive layers 26 are printed and fired, and further, the second electrodes 30 are printed and fired to form the piezoelectric/electrostrictive elements 24a and 24b. After that, the terminals 32 and 34 are printed and fired in order to electrically connect the respective electrodes 28 and 30 to the driving circuit.

In this process, when the materials are selected in such a manner that the firing temperature for each of the members is lowered in accordance with the stacking sequence, for example, when platinum (Pt) is used for the first electrode 28, lead zirconate titanate (PZT) is used for the piezoelectric/electrostrictive layer 26, gold (Au) is used for the second electrode 30, and silver (Ag) is used for the terminals 32 and 34, the material that has been already fired beforehand is not sintered again at a certain firing stage, and thus, it is possible to avoid the occurrence of inconvenience such as peeling off and aggregation of the electrode material or the like.

When appropriate materials are selected, it is also possible to successively print the respective members of the piezoelectric/electrostrictive elements 24a and 24b and the terminals 32 and 34, followed by the firing at one time. Further, it is also possible to provide, for example, the respective electrodes 30 at a low temperature after forming the piezoelectric/electrostrictive layers 26.

It is also possible that the respective members of the piezoelectric/electrostrictive elements 24a and 24b and the terminals 32 and 34 are formed in accordance with the thin film formation method such as the sputtering method and the vapor deposition method, and in this case, it is not necessarily indispensable to perform the heat treatment.

In the formation of the piezoelectric/electrostrictive elements 24a and 24b, it is also preferably conducted that the piezoelectric/electrostrictive elements 24a and 24b are previously formed on both surfaces of the ceramic green laminate 58, i.e., on the respective surfaces of the ceramic green sheets 52A and 52B, and then the ceramic green laminate 58 and the piezoelectric/electrostrictive elements 24a and 24b are co-fired. Upon co-firing, it is possible that the ceramic green laminate 58 and all the constitutional films of the piezoelectric/electrostrictive elements 24a and 24b are subjected to firing, or in alternative, those methods can be exemplified in that the first electrode 28 and the ceramic green laminate 58 are co-fired, and constitutional films other than the second electrode 30 and the ceramic green laminate 58 are co-fired.

As a method of co-firing the piezoelectric/electrostrictive elements 24a and 24b and the ceramic green laminate 58, such a method can be exemplified in that a precursor of the piezoelectric/electrostrictive layer 26 is formed, for example, by the tape forming method using the slurry raw materials, and then the precursor of the piezoelectric/electrostrictive layer 26 before firing is laminated on the surface of the ceramic green laminate 58, for example, by heat pressure-securing, followed by conducting co-firing, so as to simultaneously produce the movable section 20, the thin plate sections 16a and 16b, the piezoelectric/electrostrictive layer 26 and the fixing section 22. In this method, however, it is necessary that the electrode 28 be previously formed on the surface of the ceramic green laminate 58 and/or the piezoelectric/electrostrictive layer 26.

Other methods can be exemplified in that the electrodes 28 and 30 and the piezoelectric/electrostrictive layer 26, which are the constitutional layers of the piezoelectric/electrostrictive elements 24a and 24b, are formed on such parts of the ceramic green laminate 58 that finally become the thin plate sections 16a and 16b by the screen printing method, followed by co-firing.

The firing temperature of the piezoelectric/electrostrictive elements 24a and 24b is appropriately determined by the materials constituting them, and is generally from 500 to 1,500° C., and preferably from 1,000 to 1,400° C. for the piezoelectric/electrostrictive layer 26. In this case, in order to control the composition of the piezoelectric/electrostrictive layer 26, it is preferable that the sintering is conducted in the presence of the evaporation source of the material of the piezoelectric/electrostrictive layer 26. In the case where the piezoelectric/electrostrictive layer 26 and the ceramic green laminate 58 are co-fired, it is necessary that the firing conditions of them agree with each other. The piezoelectric/electrostrictive elements 24a and 24b are not necessarily formed on both surfaces of the ceramic laminate 60 or the ceramic green laminate 58, but of course, may be formed only on one surface thereof.

Subsequently, unnecessary portions are cut off from the ceramic laminate 60 formed with the piezoelectric/electrostrictive elements 24a and 24b as described above. The cutoff positions are located at side portions of the ceramic laminate 60, especially at portions, at which the hole 12 based on the window 54 is formed on the side surfaces of the ceramic laminate 60 by means of the cutoff (see cutting lines C1 and C2).

Those applicable as the cutoff method include the mechanical machining such as the dicing machining, the slicing machining and the wire saw machining, as well as the laser machining based on the use of, for example, the YAG laser and the excimer laser, and the electron beam machining.

Figure 19:
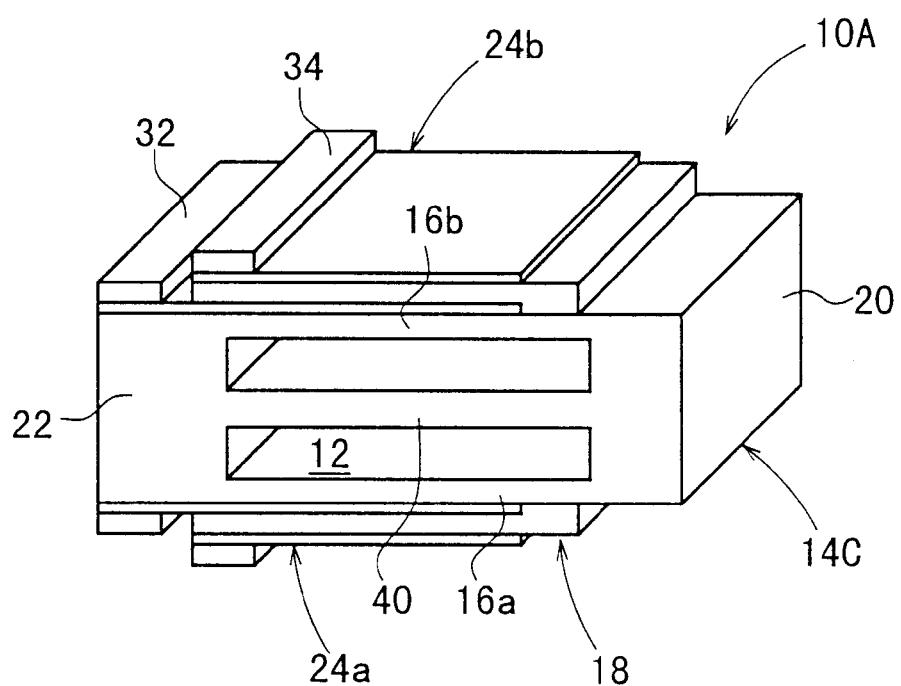
FIG. 19 illustrates a state, in which the ceramic laminate is cut along predetermined cutting lines to provide the piezoelectric/electrostrictive device according to the first embodiment.

By the cutoff as shown in FIG. 19, the piezoelectric/electrostrictive device 10A is obtained, in which the piezoelectric/electrostrictive elements 24a and 24b are formed on the ceramic substrate 14C, and the one beam section 40 is formed from the inner wall 20a of the movable section 20 to the inner wall 22a of the fixing section 22.

In the production method, the piezoelectric/electrostrictive-device 10A, in which the piezoelectric/electrostrictive elements 24a and 24b are formed on the ceramic substrate 14C, and the one beam section 40 is formed from the inner wall 20a of the movable section 20 to the inner wall 22a of the fixing section 22, is obtained simultaneously with the cutoff of the unnecessary portions from the ceramic laminate 60. Therefore, the production process can be simplified, and the yield of the piezoelectric/electrostrictive device 10A can be improved.

The piezoelectric/electrostrictive device 10B according to the second embodiment will be described with reference to FIG. 20. The same symbols are attached to those members that correspond to the piezoelectric/electrostrictive device 10A according to the first embodiment and the respective modified examples 10Aa to 10Aj, so as to omit the duplicate explanations.

Figure 20:
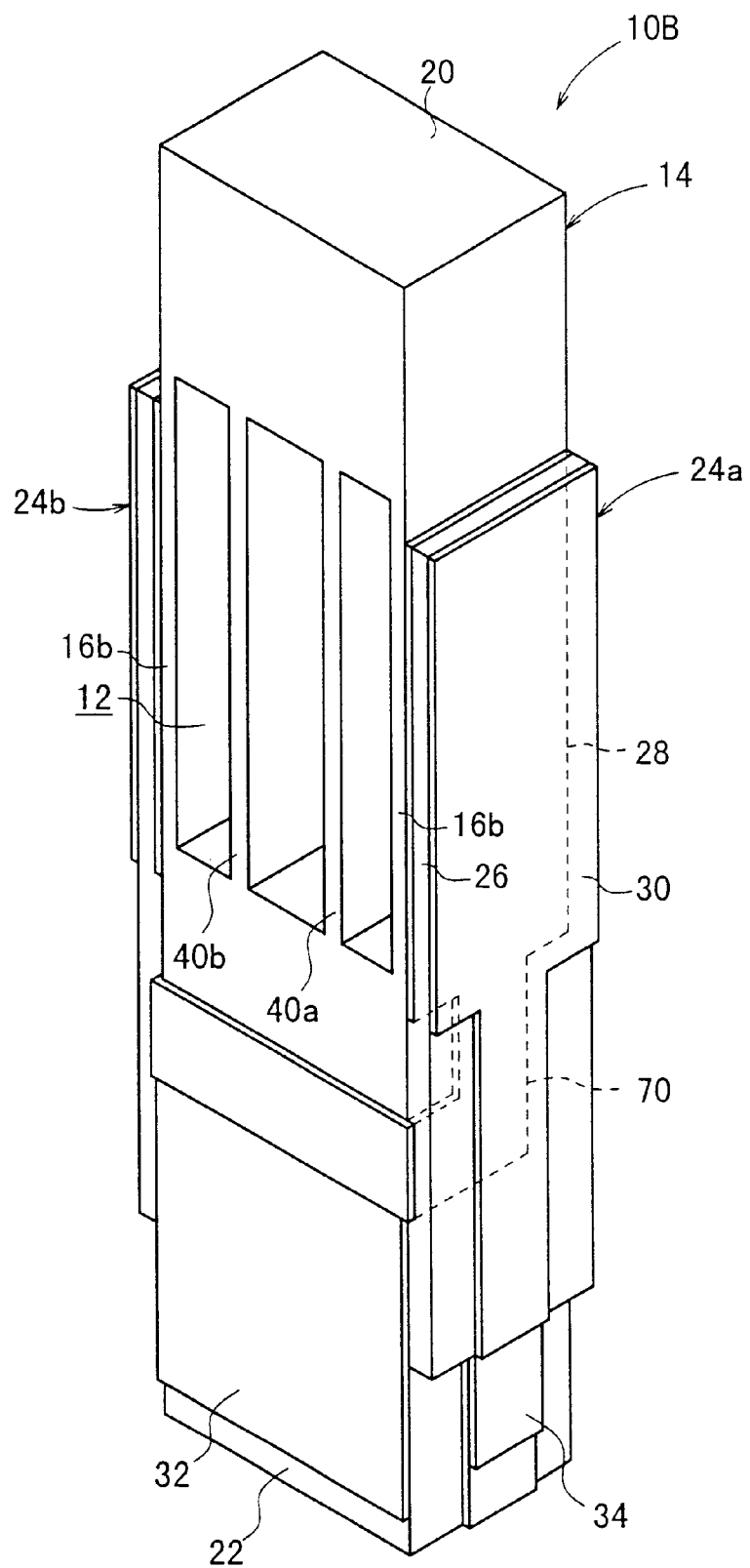
FIG. 20 shows a perspective view illustrating an arrangement of a piezoelectric/electrostrictive device according to a second embodiment.

As shown in FIG. 20, the piezoelectric/electrostrictive device 10B according to the second embodiment has the similar constitution as the piezoelectric/electrostrictive device 10A according to the first embodiment, but is different therefrom in the points in that the two beam sections 40a and 40b are provided, the first electrode 28 constituting the piezoelectric/electrostrictive elements 24a and 24b is led to the first terminal 32 formed on the front surface of the fixing section 22 via a connecting electrode 70 having an L shape to be commonly utilized, and the second electrode 30 is led to the second terminal 34 formed on the side surface of the fixing section 22.

Because the two beam sections 40a and 40b are provided, the rigidity is improved in comparison to the piezoelectric/electrostrictive device 10A according to the first embodiment, making it advantageous in realization of the high resonance frequency.

The selection as to whether the terminal structure of the piezoelectric/electrostrictive device 10A according to the first embodiment or the terminal structure of the piezoelectric/electrostrictive device 10B according to the second embodiment can be appropriately conducted depending on the driving circuit connected to the respective terminals 32 and 34.

The piezoelectric/electrostrictive device 10C according to the third embodiment will be described with reference to FIG. 21.

Figure 21:
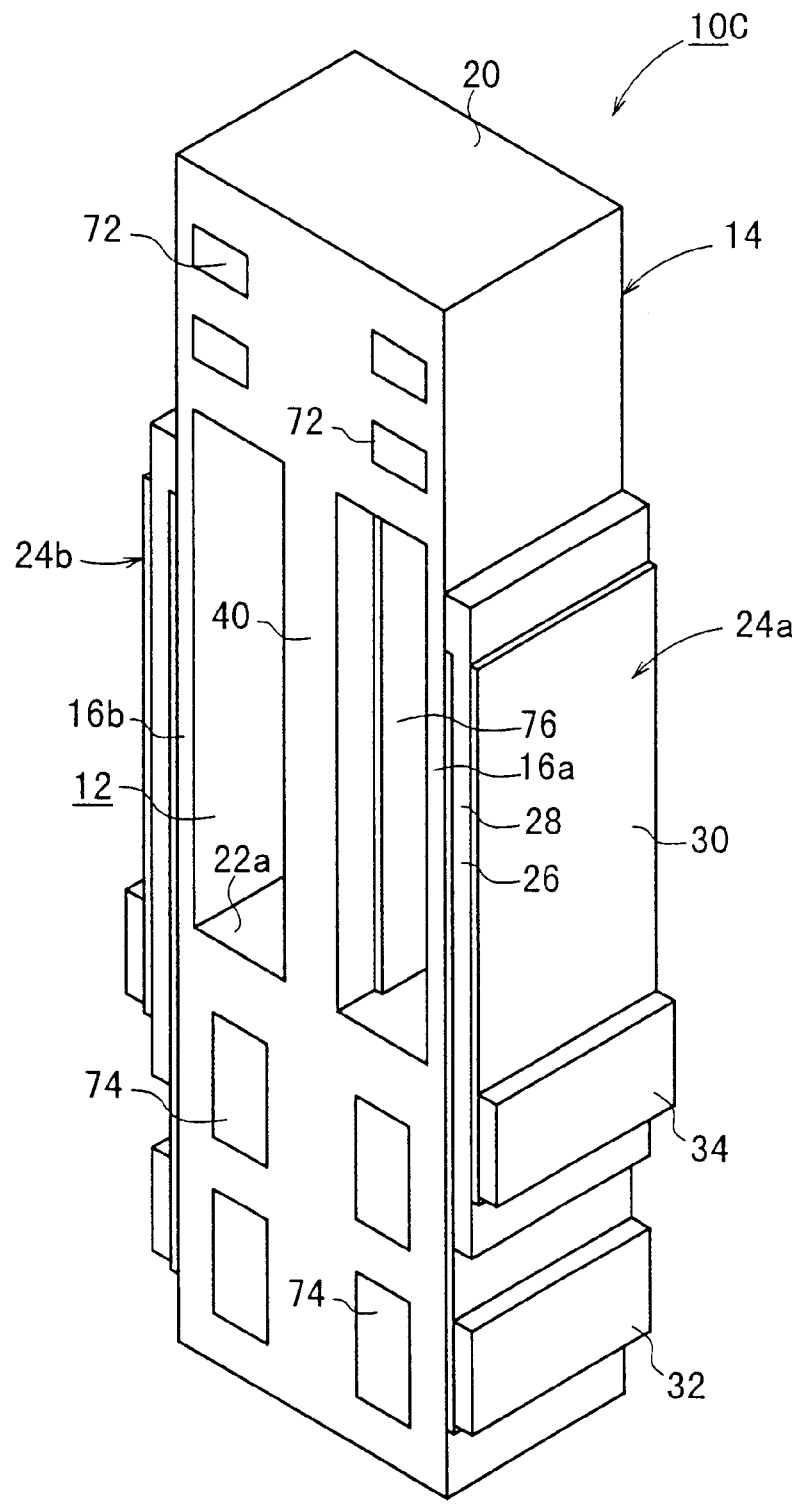
FIG. 21 shows a perspective view illustrating an arrangement of a piezoelectric/electrostrictive device according to a third embodiment.

As shown in FIG. 21, the piezoelectric/electrostrictive device 10C has the substantially similar constitution as the piezoelectric/electrostrictive device 10A according to the first embodiment, but they are different in the points in that electronic parts (not shown in the figure) are attached to the movable section 20, and a conductor pattern for connecting to the electronic circuit or the like, at which the fixing section 22 is set, is formed inside the substrate 14.

The conductor pattern comprises an outgoing electrode 72 formed to be exposed on the front surface of the movable section 20, an outgoing electrode 74 formed to be exposed on the front surface of the fixing section 22, and a main body 76 of the conductor pattern that is formed as wiring along the side surface of the beam section 40 and is electrically connected to the outgoing electrodes 72 and 74.

In other words, by providing the beam section 40, a conductor line for connecting the electronic parts attached to the movable section 20 to the electronic circuit, to which the fixing section 22 is set, is not necessarily wired outside the piezoelectric/electrostrictive device 10C, but they can be wired through the conductor pattern inside the piezoelectric/electrostrictive device 10C, whereby the wiring process can be simplified, and the compaction of the electronic parts using the piezoelectric/electrostrictive device 10C can be realized.

Figure 22:
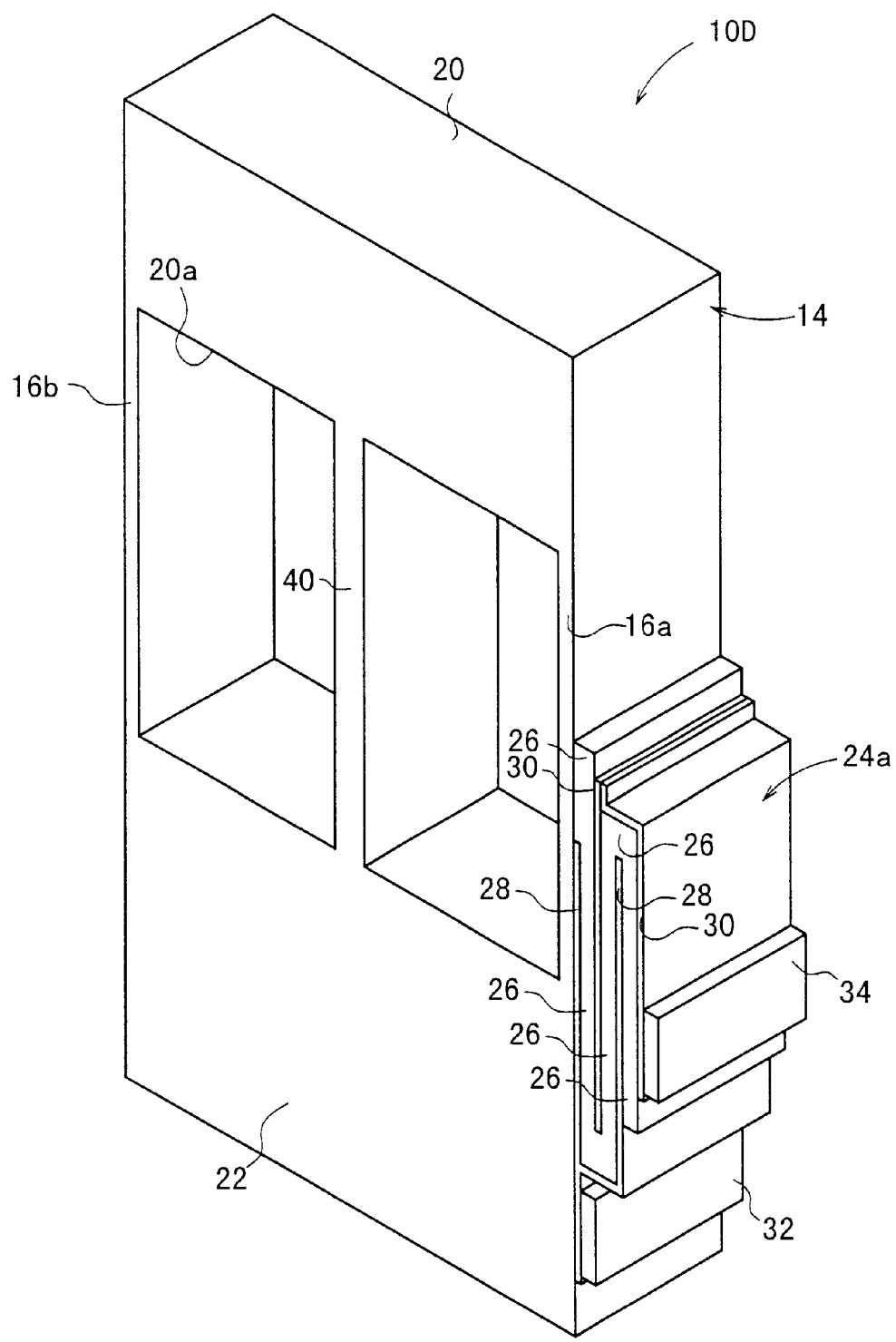
FIG. 22 shows a perspective view illustrating an arrangement of a piezoelectric/electrostrictive device according to a fourth embodiment.
Figure 23:
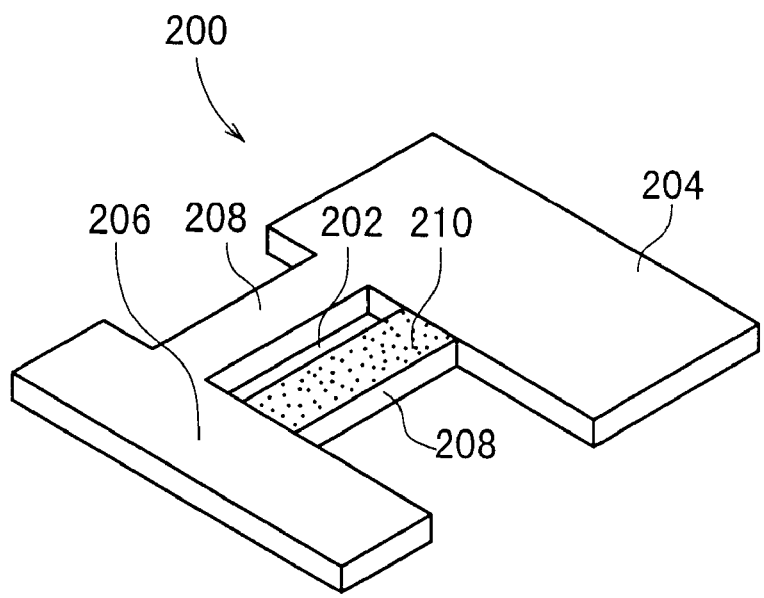
FIG. 23 shows an arrangement of a conventional piezoelectric/electrostrictive device.

While the example where the piezoelectric/electrostrictive elements 24a and 24b are formed on the pair of the thin plate sections 16a and 16b is described above, it is possible that the piezoelectric/electrostrictive element 24a is formed on one thin plate section 16a as shown in FIG. 22 like the piezoelectric/electrostrictive device 10D according to the fourth embodiment.

The piezoelectric/electrostrictive device 10D, in which the piezoelectric/electrostrictive element 24a is formed on only one thin plate section 16a of the pair of mutually opposing thin plate sections 16a and 16b as described above, makes it possible to decrease the rigidity of the thin plate section 16b on which the piezoelectric/electrostrictive element 24b is not formed.

As a result, when comparison may be made concerning the magnitude of the displacement obtained by operating one piezoelectric/electrostrictive element 24a, between the piezoelectric/electrostrictive device (for example, piezoelectric/electrostrictive device 10Ag), in which the piezoelectric/electrostrictive elements 24a and 24b are formed on both sides and the piezoelectric/electrostrictive device 10D, in which the piezoelectric/electrostrictive element 24a is formed on only one side, the piezoelectric/electrostrictive device 10D, in which the piezoelectric/electrostrictive element 24a is formed on only one side, has such a feature that it is possible to obtain greater displacement owing to the effect that the rigidity of the thin plate section 16b disposed on the opposed side is low.

The piezoelectric/electrostrictive device described above can be utilized as the active device including, for example, vibrators, resonators, oscillators, and discriminators for the communication and the power generation, various transducers, various actuators, frequency region functional parts (filters), transformers, as well as the sensor element for various sensors including, for example, ultrasonic sensors, acceleration sensors, angular velocity sensors, shock sensors and mass sensors. Especially, The piezoelectric/electrostrictive device can be preferably utilized for various actuators to be used for the mechanism for adjusting the displacement and the positioning and for adjusting the angle for various precision parts such as those of optical instruments and precision mechanical equipments.

It is a matter of course that the piezoelectric/electrostrictive device and the method of producing the same according to the invention are not limited to the embodiments described above, which may be embodied in other various forms without deviating from the gist or essential characteristics of the invention.

What is claimed is:

1. A piezoelectric/electrostrictive device having a pair of mutually opposing thin plate sections, a movable section, and a fixing section for supporting said thin plate sections and said movable section, said piezoelectric/electrostrictive device comprising:

one or more piezoelectric/electrostrictive elements arranged on at least one thin plate section of said pair of thin plate sections; and a hole formed by both inner walls of said pair of thin plate sections, an inner wall of said movable section, and an inner wall of said fixing section, wherein at least one beam section is provided extending from said inner wall of said movable section to said inner wall of said fixing section.

2. A piezoelectric/electrostrictive device according to claim 1, wherein surfaces of said thin plate sections, on which said piezoelectric/electrostrictive elements are formed, are designated as side surfaces of said thin plate sections, and a width of said side surfaces of said thin plate sections in the minor side direction is designated as the width of said thin plate sections, wherein a width of said beam section is at least ⅕ of said width of said thin plate sections.

3. A piezoelectric/electrostrictive device according to claim 1, wherein surfaces of said thin plate sections, on which said piezoelectric/electrostrictive elements are formed, are designated as side surfaces of said thin plate sections, and a length of said side surfaces of said thin plate sections in the major side direction is designated as a length Le of said thin plate sections, wherein a ratio (Le/Tb) of said length Le of said thin plate sections to a total thickness Tb of said beam section is from 5 to 200.

4. A piezoelectric/electrostrictive device according to claim 1, wherein said thin plate sections, said movable section and said fixing section comprise an integrated ceramic substrate formed by co-firing a ceramic green laminate, followed by cutting off unnecessary portions.

5. A piezoelectric/electrostrictive device according to claim 4, wherein said piezoelectric/electrostrictive elements are of a film form and integrated with said ceramic substrate by firing.

6. A piezoelectric/electrostrictive device according to claim 1, wherein said piezoelectric/electrostrictive elements have a piezoelectric/electrostrictive layer and a pair of electrodes formed on said piezoelectric/electrostrictive layer.

7. A piezoelectric/electrostrictive device according to claim 6, wherein said piezoelectric/electrostrictive elements are constructed by laminating a plurality of said piezoelectric/electrostrictive layers and said pair of electrodes.

8. A piezoelectric/electrostrictive device according to claim 1, wherein said hole is filled with a gel-like material.

* * * * *